US012660644B2

(12) United States Patent
Numata et al.

(10) Patent No.: US 12,660,644 B2
(45) Date of Patent: Jun. 16, 2026

(54) METHOD OF MANUFACTURING SEMICONDUCTOR DEVICE AND SEMICONDUCTOR DEVICE

(71) Applicant: RENESAS ELECTRONICS CORPORATION, Tokyo (JP)

(72) Inventors: Noriko Numata, Tokyo (JP); Koichi Hasegawa, Tokyo (JP); Tatsuaki Tsukuda, Tokyo (JP)

(73) Assignee: Renesas Electronics Corporation, Tokyo (JP)

( * ) Notice: Subject to any disclaimer, the term of this patent is extended or adjusted under 35 U.S.C. 154(b) by 430 days.

(21) Appl. No.: 18/307,394

(22) Filed: Apr. 26, 2023

(65) Prior Publication Data

US 2024/0006275 A1     Jan. 4, 2024

(30) Foreign Application Priority Data

Jun. 29, 2022     (JP) ................................. 2022-104785

(51) Int. Cl.
| | |
|---|---|
| *H01L 21/56* | (2006.01) |
| *H01L 23/495* | (2006.01) |
| *H10W 70/40* | (2026.01) |
| *H10W 74/01* | (2026.01) |
| *H10W 74/10* | (2026.01) |
| *H10W 72/00* | (2026.01) |
| *H10W 72/50* | (2026.01) |
| *H10W 90/00* | (2026.01) |

(52) U.S. Cl.
CPC ....... *H10W 70/481* (2026.01); *H10W 70/417* (2026.01); *H10W 74/01* (2026.01); *H10W 74/114* (2026.01); *H10W 72/07631* (2026.01);

*H10W 72/5525* (2026.01); *H10W 72/871* (2026.01); *H10W 72/886* (2026.01); *H10W 90/736* (2026.01); *H10W 90/755* (2026.01); *H10W 90/767* (2026.01)

(58) Field of Classification Search
CPC .................... H01L 24/32; H01L 24/73; H01L 2224/32245; H01L 2224/40175; H01L 2224/45147; H01L 2224/48175; H01L 2224/73221; H01L 2224/73263; H01L 2224/84897; H10W 70/481; H10W 74/114; H10W 70/417; H10W 74/01
See application file for complete search history.

(56) References Cited

U.S. PATENT DOCUMENTS

| | | | |
|---|---|---|---|
| 7,863,107 B2 | 1/2011 | Tamimoto et al. | |
| 10,910,337 B2 | 2/2021 | Okunishi et al. | |

(Continued)

FOREIGN PATENT DOCUMENTS

| | | |
|---|---|---|
| JP | 2009-147103 A | 7/2009 |
| JP | 2018-073970 A | 5/2018 |
| WO | 2020/255663 A1 | 12/2020 |

OTHER PUBLICATIONS

Notice of Reasons for Refusal received in corresponding Japanese Patent Application No. 2022-104785, dated 1 Oct. 7, 2025.

*Primary Examiner* — Walter H Swanson
(74) *Attorney, Agent, or Firm* — Rimon P.C.

(57) ABSTRACT

A source pad electrically coupled with a source of a MOSFET of a semiconductor chip and located at a position below a lead in cross-sectional view is electrically connected with the lead for source via a conductive member bonded to the source pad and a wire bonded to the conductive member.

13 Claims, 41 Drawing Sheets

(56)     References Cited

U.S. PATENT DOCUMENTS

| 2010/0207279 | A1* | 8/2010 | Law | ......................... H01L 24/73 |
| | | | | 257/E21.511 |
| 2022/0302071 | A1 | 9/2022 | Fuji | |

* cited by examiner

*FIG. 6*

METHOD OF MANUFACTURING SEMICONDUCTOR DEVICE AND SEMICONDUCTOR DEVICE

CROSS-REFERENCE TO RELATED APPLICATIONS

The disclosure of Japanese Patent Application No. 2022-104785 filed on Jun. 29, 2022, including the specification, drawings and abstract is incorporated herein by reference in its entirety.

BACKGROUND

The present disclosure relates to a technique for manufacturing a semiconductor device and, for example, to a technique that can be effectively applied to a power semiconductor device incorporated in a power control circuit.

Here, there are disclosed techniques listed below.

[Patent Document 1] Japanese Unexamined Patent Application Publication No. 2018-73970

[Patent Document 2] Japanese Unexamined Patent Application Publication No. 2009-147103

Patent Document 1 discloses a semiconductor device including a semiconductor chip including a MOSFET, a die pad on which the semiconductor chip is mounted, a lead disposed at a position higher than the die pad, and a wire electrically connecting the source pad of the semiconductor chip and the lead.

Further, Patent Document 2 discloses a semiconductor device in which aluminum ribbons are bonded to a plurality of portions of a source pad of a semiconductor chip using a wedge tool which is a bonding tool.

SUMMARY

In recent years, a semiconductor device (in particular, a current path between a source pad serving as an output and a source lead) having a low ON-resistance (namely, a semiconductor device capable of flowing a large current) is required. In order to realize the low ON-resistance, as each Patent Document described above, it is conceivable to 1) couple the source pad and the source lead via a plurality of conductive members, 2) increase a diameter of a conductive member, which is coupling the source pad and the source lead, for source, or 3) bond a conductive member for source to the source pad at multiple portions of the source pad. According to the studies by the inventors of the present application, it has been found that the ON-resistance can be further improved due to a position where the conductive member for source is bonded to the source pad.

Other objects and novel features will become apparent from the description of this specification and the accompanying drawings.

A method of manufacturing a semiconductor device according to one embodiment, includes a step of (a) providing a lead frame having a die pad and a first lead spaced apart from the die pad, the die pad having a first surface and a second surface opposite the first surface. Also, the method includes a step of (b), after the step of (a), mounting a semiconductor chip on the first surface of the die pad, the semiconductor chip having a MOSFET and a source pad electrically coupled with a source of the MOSFET.

Also, the method includes steps of: (c) after the step of (b), bonding a first conductive member to the source pad located below the first lead in cross-sectional view, by using a first bonder; (d) after the step of (c), bonding a second conductive member to each of the first conductive member and the first lead, by using a second bonder; and (e) after the step of (d), sealing the semiconductor chip, the first conductive member and the second conductive member with a resin. Here, the first bonder has: a cutter capable of cutting the first conductive member; a guide capable of supplying the first conductive member; and a wedge tool located adjacent to the cutter and capable of pressing the first conductive member. In the step of (c), the first bonder is disposed such that the guide of the first bonder is located farther away from the first lead than the wedge tool of the first bonder. The step of (c) further comprises: (c1) bonding a first portion of the first conductive member to a first-pad-bonding portion of the source pad; and (c2) after the step of (c1), bonding a second portion of the first conductive member to a second-pad-bonding portion, which is located farther away from the first lead than the first-pad-bonding portion, of the source pad.

According to the above one embodiment, it is possible to improve a performance of the semiconductor device.

BRIEF DESCRIPTION OF THE DRAWINGS

FIG. 6 is a cross-sectional view along A-A line shown in FIG. 5.

DETAILED DESCRIPTION

Figure 1:
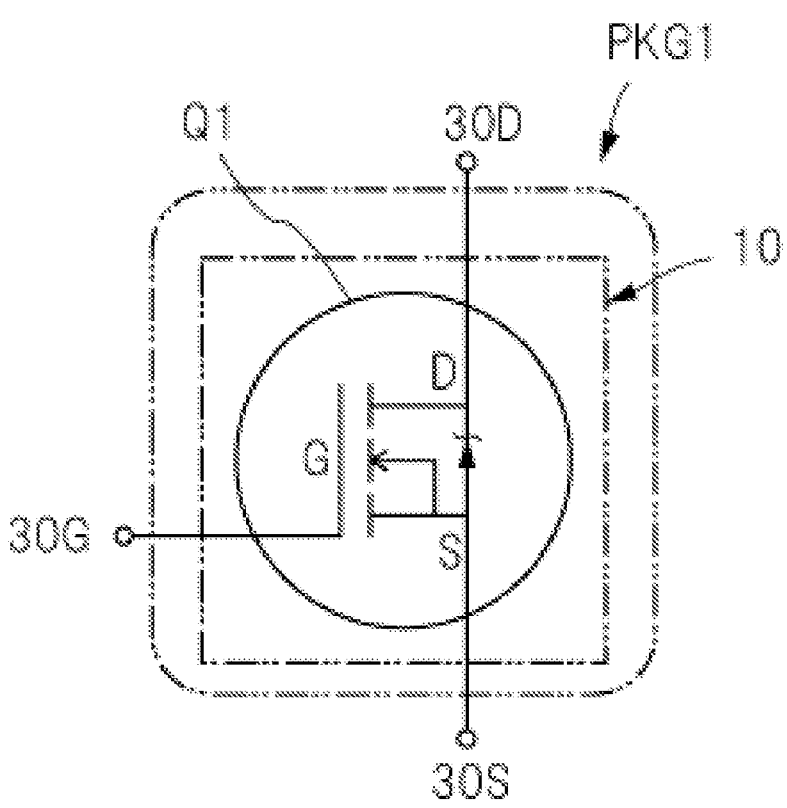
FIG. 1 is an explanatory view schematically showing an example of a circuit of a semiconductor device according to an embodiment.

Description of Form, Basic Term, and Usage in Present Application

In the present application, the description of the embodiment will be divided into a plurality of sections or the like as required for convenience, but unless expressly stated otherwise, these are not independent of each other, and each part of a single example, one of which is a partial detail or a part or all of the other, whether before or after the description, or the like, is modified example or the like. In principle, descriptions of similar parts are omitted. Also, each component in an embodiment is not essential, unless expressly stated otherwise, theoretically limited to that number, and obviously otherwise from the context.

Similarly, in the description of the embodiment and the like, "X consisting of A" or the like with respect to the material, composition, and the like does not exclude elements other than A, except when it is clearly indicated that this is not the case and when it is obvious from the context that this is not the case. For example, regarding a component, it means "X including A as a main component" or the like. For example, the term "silicon member" or the like is not limited to pure silicon, and it is needless to say that it also includes a member containing a SiGe (silicon-germanium) alloy, a multi-element alloy containing silicon as its main component, other additives, or the like. In addition, gold plating, Cu layers, nickel plating, and the like, unless otherwise specified, not only pure, but also gold, Cu, nickel, and the like as the main constituent members, respectively, shall be included.

In addition, reference to a specific numerical value or quantity may be greater than or less than that specific numerical value, unless expressly stated otherwise, theoretically limited to that number, and obviously not so from the context.

In the drawings of the embodiments, the same or similar parts are denoted by the same or similar symbols or reference numerals, and the description will not be repeated in principle.

In addition, in the attached drawings, hatching and the like may be omitted even in a cross-section when it becomes complicated or when it is clearly distinguished from a gap. In this connection, even if the hole is closed in plan, the outline of the background may be omitted when it is obvious from the description or the like. In addition, hatching or dot patterns may be added to indicate that the region is not a void even if it is not a cross-section or to indicate the boundary of the area.

In the following description, the terms "contact", "adhesive", "bonding", "peeling", and "connection" are used in the following meaning. "Contact" refers to a state in which at least a portion of two separable members are in contact with each other. "Adhesive" refers to a state in which at least a portion of two separable members (adhesives) are bonded and fixed to each other via an adhesive. In addition, "bonding" refers to a state in which at least a portion of two separable members (adherends) are bonded to each other and fixed. "Binding" as described above includes mechanical bonding, such as an anchoring effect, bonding by physical interactions, such as intermolecular forces, and bonding by chemical interactions, such as covalent bonding. In addition, "junction" includes a case where other members (e.g., adhesives) are interposed between the adherends, and a case where other members are not interposed. That is, the "bonded state" includes the "bonded state". In addition, "peeling" means that the above-described "bonding" state is released and the state is changed to a separable state. In addition, the term "peeling" includes a state in which the junction is released at a part of the joint portion as well as a state in which the connection is released at the entire joint portion of the two members. Further, the term "connection" refers to a state in which two members communicate with each other (the connection path is not divided in the middle and is continuously connected). Whether or not another member is interposed between the two members is not limited. For example, "a state in which the A member and the B member are electrically connected to each other" means a state in which the A member and the B member are electrically conductive, and includes a case where the C member is interposed between the A member and the B member. In addition, simply "a state in which the A member and the B member are connected" means a state in which the A member and the B member are fixed, and includes a case where the C member is interposed between the A member and the B member. Further, for example, the "state in which the A member and the B member are connected" includes a case where the A member and the B member are formed as an integral body that cannot be separated from each other and are distinguished from each other in shape or function. In this manner, a state in which the member A and the member B are formed as an integral body may be referred to as "coupling".

Further, in the following explanation, solder, solder material, solder material, or when described as solder components, for example, lead (Pb) containing Sn—Pb solder, or a so-called lead-free solder substantially free of Pb. Examples of lead-free solders include, for example, tin (Sn), tin-bismuth (Sn—Bi), tin-copper-silver (Sn—Cu—Ag), tin-copper (Sn—Cu), and the like. Here, the lead-free solder means a solder in which the content of lead (Pb) is 0.1 wt % or less, and this content is determined as a standard of RoHS (Restriction of Hazardous Substances) instruction.

In the present embodiment, a semiconductor device called a power device or a power semiconductor device, which is incorporated in a power control circuit such as a power supply circuit, will be described as an exemplary semiconductor device. The semiconductor device described below is incorporated in the power converter and functions as a switching device.

<Example of Circuit Configuration>

Figure 2:
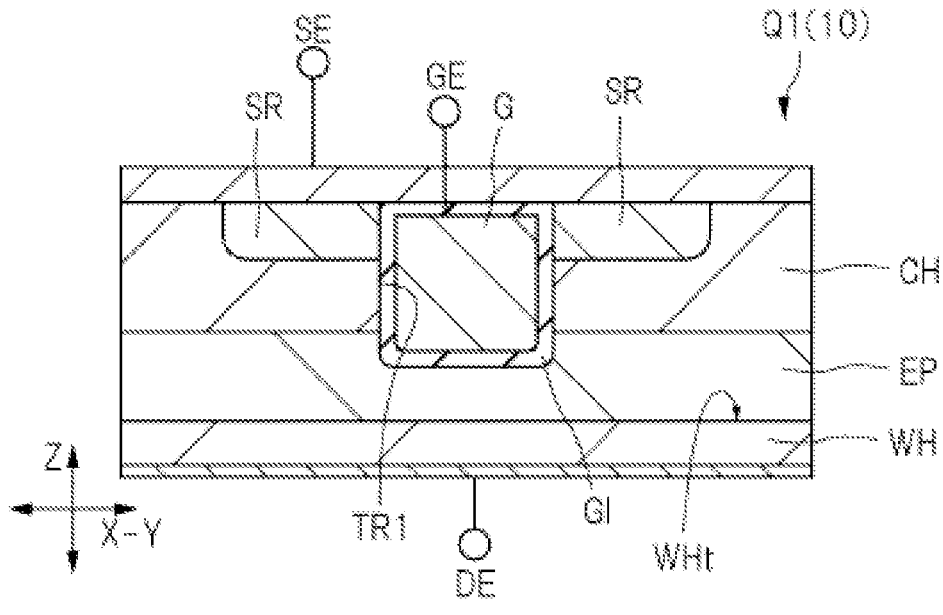
FIG. 2 is a partial cross-sectional view showing an example of a device structure of a field effect transistor shown in FIG. 1.

FIG. 1 is an explanatory view schematically showing an example of a circuit of a semiconductor device according to the present embodiment. FIG. 2 is a partial cross-sectional view showing an example of a device structure of a field effect transistor shown in FIG. 1.

The semiconductor device for power control, called power semiconductor device, includes a semiconductor element such as diode, thyristor, or transistor. The transistor is used in various fields, but, like the present embodiment, the transistor that is incorporated in the power control circuit through which a large current, for example, greater than or equal to 1 A (amperes) flows and that operate as a switching element is referred to as a power transistor. As shown in FIG. 1, the semiconductor device PKG1 of the present embodiment includes a semiconductor chip 10 on which a transistor Q1 that is a power transistor is formed. In the present embodiment shown in FIGS. 1 and 2, the transistor Q1 formed in the semiconductor chip 10 is a field-effect transistor, specifically, a MOSFET (Metal Oxide Semiconductor Field Effect Transistor). In a powered semiconductor device, a transistor is used, for example, as a switching device. The MOSFET used for the power semiconductor device is called a power MOSFET.

The above-described MOSFET is used to describe a field-effect transistor in which a gate electrode made of a conductive material is disposed on a gate insulating film. Therefore, even when the term "MOSFET" is used, a gate-insulating film other than the oxide film is not excluded. Also, the term "MOSFET" does not exclude non-metallic gate-electrode materials such as polysilicon.

The transistor Q1 shown in FIG. 1 is formed of, for example, an n-channel field-effect transistor as shown in FIG. 2. FIG. 2 is a main portion cross-sectional view illustrating an exemplary device configuration of the field-effect transistor shown in FIG. 1.

In the embodiment shown in FIG. 2, an $n^-$ type epitaxial layer EP is formed on a main surface WHt of a semiconductor substrate WH made of, for example, n type monocrystalline silicon. The semiconductor substrate WH and the epitaxial layer EP compose a drain region of MOSFET (a region corresponding to the drain D shown in FIG. 1). The drain regions are electrically connected to the drain electrodes DE formed on the back surface of the semiconductor chip 10.

On the epitaxial layer EP, a channel formation region CH which is a $p^+$ type semiconductor region is formed, and on the channel formation region CH, a source region (a region corresponding to the source S shown in FIG. 1) SR which is an $n^+$ type semiconductor region is formed. The source area SR is electrically connected to a source pad (electrode, source electrode pad) SE formed on the main surface of the semiconductor chip 10 via a lead wire. In addition, trenches (openings and trenches) TR1 that penetrate through the channel-forming region CH from upper surface of the source-region SR and reach the inside of the epitaxial-layer EP are formed in the semiconductor region stacked on semiconductor substrate WH.

In addition, a gate-insulating film GI is formed on the inner wall of the trench TR1. Further, on the gate insulating film GI, a gate G stacked so as to fill the trench TR1 is formed. The gate G is electrically connected to a gate pad (electrode, gate electrode pad) GE of the semiconductor chip via a lead wire.

In the transistor Q1, since the drain region and the source region SR are arranged in the thickness direction with the channel formation region CH interposed therebetween, a channel is formed in the thickness direction (hereinafter, referred to as a vertical channel configuration). In this case, the area occupied by the device in a plan view can be reduced as compared with a field-effect transistor having a lateral channel structure in which a channel is formed along the main surface WHt. Therefore, the planar size of the semiconductor chip 10 can be reduced.

Further, in the case of the above-described vertical channel structure, since the channel width per unit area can be increased in a plan view, the ON-resistance can be reduced. Note that FIG. 2 is a diagram showing an element structure of a field-effect transistor, and in the semiconductor chip 10 shown in FIG. 1, a plurality of (a large number of) transistor Q1 having an element structure as shown in FIG. 2, for example, are connected in parallel. Accordingly, a power MOSFET in which a large current, for example, exceeding 1 ampere, flows can be configured.

As described above, when the plurality of transistor Q1 having the vertical channel-structure are connected in parallel to form a MOSFET, the electric characteristics (mainly, the breakdown voltage characteristics, the ON-resistance characteristics, and the capacitance characteristics) of MOS-FET vary depending on the planar dimensions of the semiconductor chip 10. For example, if the planar area of the semiconductor chip 10 is increased, the number of cells (that is, the number of elements) of the transistor Q1 connected in parallel increases, such that the ON-resistance decreases and the capacitance increases.

In FIG. 1 and FIG. 2, MOSFET is exemplified as an exemplary power transistor included in the power semiconductor device, but various modified example can be applied. For example, an insulated gate bipolar transistor (IGBT; Insulated Gate Bipolar Transistor) may be provided in place of MOSFET.

<Semiconductor Device>

Figure 3:
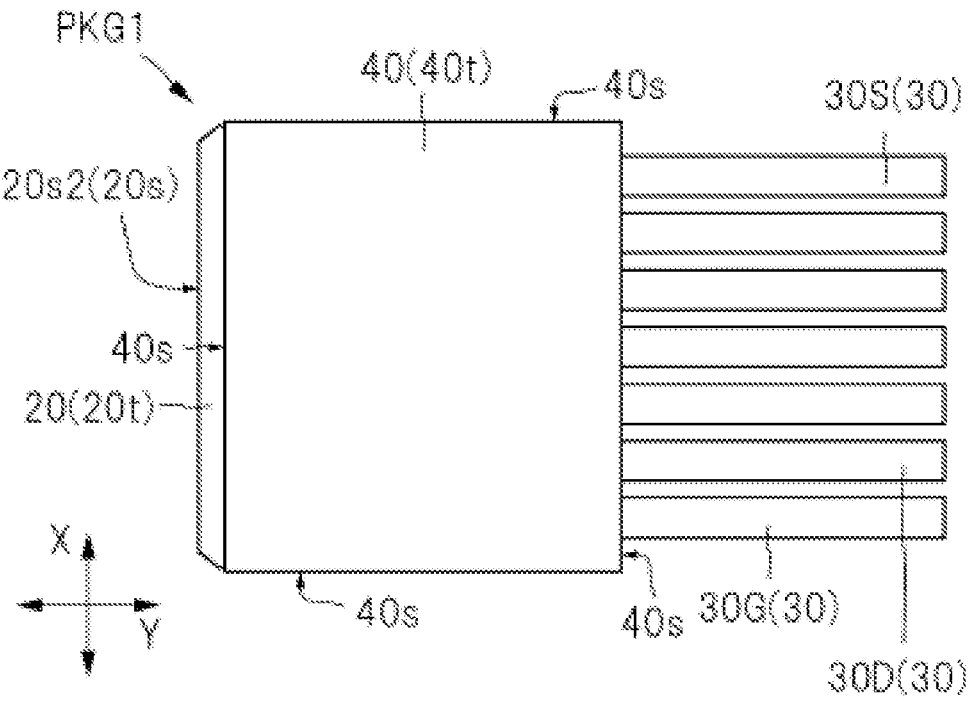
FIG. 3 is an upper surface view of the semiconductor device shown in FIG. 1.
Figure 4:
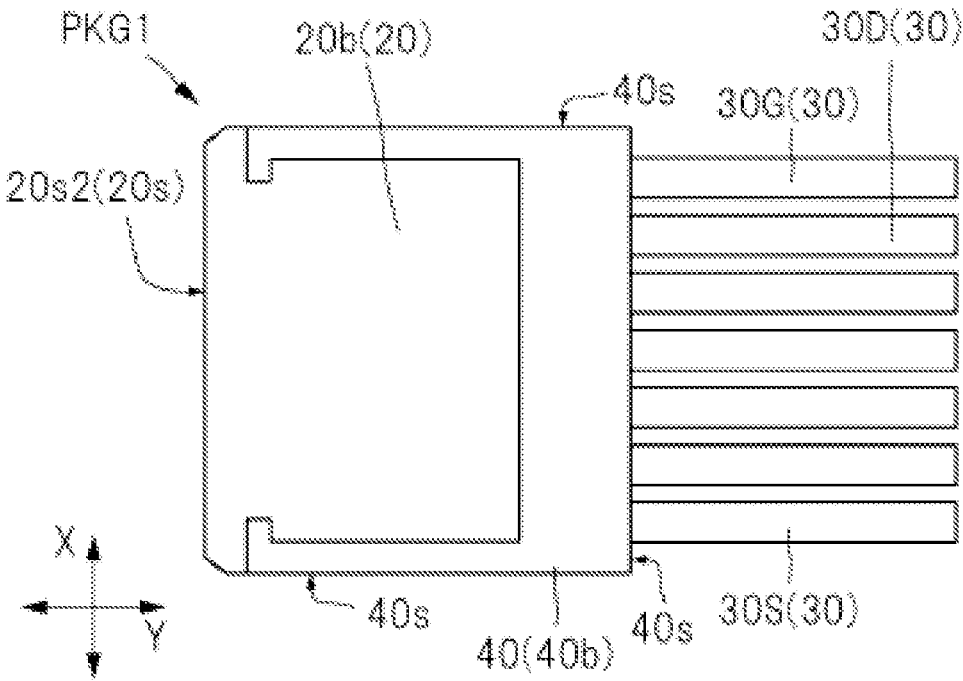
FIG. 4 is a lower surface view of the semiconductor device shown in FIG. 3.
Figure 5:
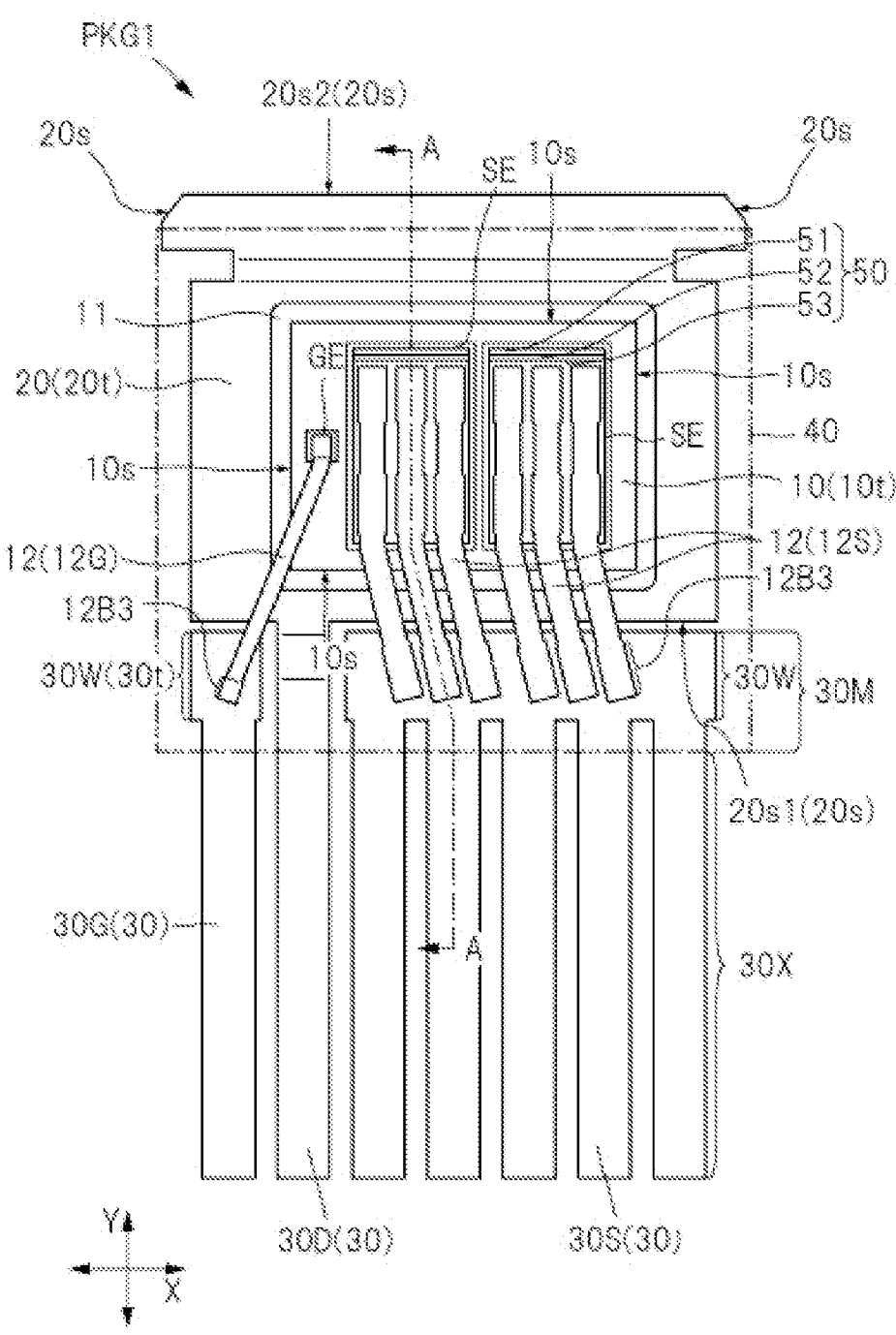
FIG. 5 is a perspective plan view showing an internal structure of the semiconductor device in a state that a sealing body shown in FIG. 3 is removed.
Figure 6:
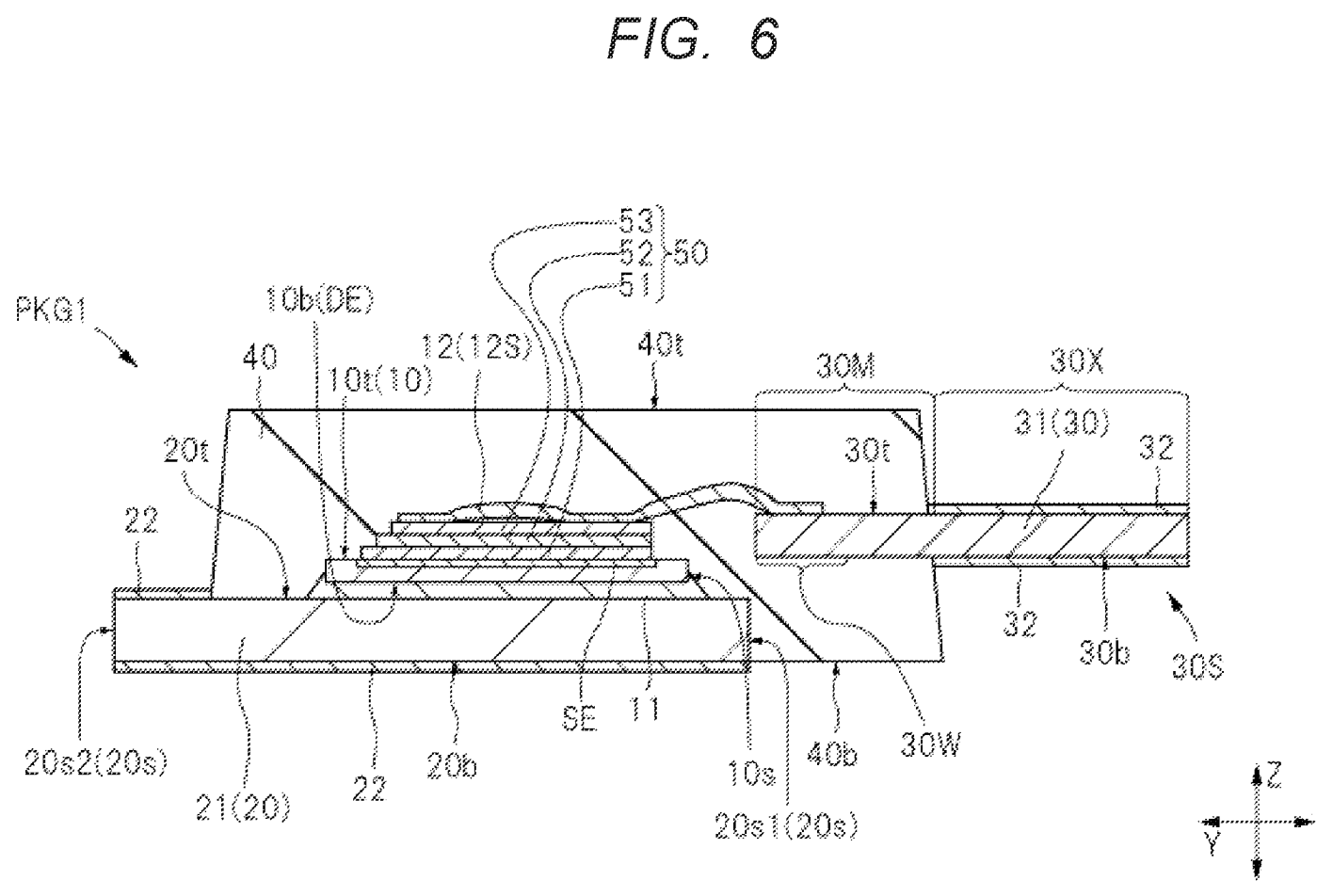

Next, the packaging configuration of semiconductor device PKG1 shown in FIG. 1 will be described. FIG. 3 is an upper surface view of the semiconductor device shown in FIG. 1. FIG. 4 is a lower surface view of the semiconductor device shown in FIG. 3. FIG. 5 is a perspective plan view showing an internal structure of the semiconductor device in a state that a sealing body shown in FIG. 3 is removed. FIG. 6 is a cross-sectional view along A-A line shown in FIG. 5.

The semiconductor device PKG1 of the present embodiment includes a semiconductor chip 10 (see FIGS. 5 and 6), a die pad (a metal plate, a chip mounting portion, and a heat sink) on which the semiconductor chip 10 is mounted (see FIGS. 3 to 6), and a plurality of leads (terminals) 30 as external terminals. The semiconductor chip 10 and the plurality of leads are electrically connected via a wire 12S and a plurality of wires (conductive members) 12 (refer to FIGS. 5 and 6). Further, upper surface 20*t* of the semiconductor chip 10 and the die pad 20 and the inner portions (inner lead portions, sealed portions) 30M (refer to FIGS. 5 and 6) of the plurality of leads 30 are sealed by a sealing body (a resin sealing body, a resin body, a mold resin) 40. The wire 12S will be described later.

As shown in FIG. 5, in a plan view, each of the plurality of leads 30 extends in the Y direction and is arranged side by side with the die pad 20 along the Y direction. Further, the plurality of leads 30 are arranged so as to be adjacent to each other along the X direction intersecting with the Y direction (orthogonal in the example of FIG. 5). In the embodiment shown in FIG. 5, in a plan view, a plurality of source leads (source leads, source terminals) 30S, drain leads (drain leads, drain terminals) 30D, and gate leads (gate leads, gate terminals) 30G are arranged in this order along the X direction. Each of the plurality of leads 30 includes an inner portion 30M sealed to the sealing body 40, and an outer portion (an outer lead portion, an exposed portion) 30X exposed from the sealing body 40. Also, as shown in FIG. 6, each of the plurality of leads 30 has an opposing lower surface 30*b* of upper surface 30*t* and upper surface 30*t*.

Of the plurality of leads 30, the lead 30D for draining is formed integrally with the die pad 20. In the manufacturing process of the semiconductor device PKG1, the lead 30D for drain functions as a suspension lead supporting the die pad 20. The lead 30D as the suspension lead is bent such that the die pad 20 is located at a position below the lead 30S in a cross-sectional view.

As shown in FIG. 6, the semiconductor chip 10 has a front surface (surface, upper surface) 10*t* and a back surface (surface, bottom surface) 10*b* located on the other side of the front surface 10*t*. Further, as shown in FIG. 5, the front 10*t* (and the back surface 10*b* shown in FIG. 6) of the semiconductor chip 10 has a quadrangular shape in plan view, and has four side surface 10*s* at the peripheral portion. In the example shown in FIG. 5, the semiconductor chip 10 has a rectangular shape in a plan view, and the long sides extend along the X direction.

As shown in FIG. 5, a gate pad GE electrically connected to the gate G (see FIG. 1) and a source pad SE electrically connected to the source S (see FIG. 1) are formed on the front of the semiconductor chip 10. As shown in FIG. 6, a drain electrode DE electrically connected to the drain D (see FIG. 1) is formed on the back surface 10*b* of the semiconductor chip 10. In the embodiment shown in FIG. 6, the entire back surface of the semiconductor chip 10 is the drain-electrode DE.

As shown in FIG. 2, when the semiconductor chip 10 has a vertical channel-structure, the ON-resistance can be reduced by reducing the thickness of the semiconductor chip 10 (by reducing the distance between the front 10*t* and the back surface 10*b* shown in FIG. 6). On the other hand, from the viewpoint of increasing the heat capacity of the die pad 20 or increasing the cross-sectional area of the conductive path through which the current flows, the thickness of the die pad is preferable larger. Therefore, in the embodiment shown in FIG. 6, the thickness of the die pad 20 is larger than the thickness of the lead 30 (specifically, the lead 30S for the source shown in FIG. 5). For example, the thickness of the lead 30 (the distance from upper surface 30*t* to the lower surface 30*b*) is about 0.4 mm to 0.6 mm, and the thickness of the die pad 20 (the distance from upper surface 20*t* to the lower surface 20*b*) is about 0.5 mm to 1.3 mm.

The semiconductor device PKG1 includes a die pad (a metal plate, a chip mounting portion, and a heat sink) 20 on which the semiconductor chip 10 is mounted. As shown in FIG. 6, the die pad 20 has an upper surface (surface, main surface, front surface, chip mounting surface) 20*t* in which the semiconductor chip 10 is mounted via the die bonding material 11, and a lower surface (surface, main surface, back surface, exposed surface, mounting surface) 20*b* facing away from upper surface 20*t*. In the embodiment shown in FIG. 5, the planar size of the semiconductor chip 10 (the area of the surface 10*t*) is smaller than the planar size of the die pad 20 (the area of upper surface 20*t*). As shown in FIG. 4, the die pad 20 has a plurality of side surface 20*s* connected to the lower surface 20*b* at the peripheral edge portion.

As shown in FIG. 5, the die pad 20 is formed integrally with a lead 30D serving as a drain terminal. The lead 30D is an external terminal electrically connected to the drains D shown in FIG. 1. As shown in FIG. 6, a drain electrode DE connected to a drain D of a transistor Q1 (refer to FIG. 1) which is a MOSFET is formed on a back surface 10*b* of the semiconductor chip 10. The drain-electrode DE is electrically connected to the die pad 20 via a die bonding material 11 made of a conductive material. The die bonding material 11 is, for example, a solder or a conductive resin which is a cured product of a mixture of conductive particles such as silver (Ag) particles and a resin. The lead 30D is connected to the die pad 20, and is electrically connected to the drain-electrode DE of the semiconductor chip 10 via the die pad 20 and the die bonding material 11. Further, the lead 30D is connected to the die pad 20, and has a function as the suspension lead for supporting the die pad 20 in a semiconductor device manufacturing process to be described later.

In the present embodiment, since the lower surface 20*b* of the die pad 20 is exposed from the sealing body 40, the die pad 20 itself can be treated as a drain terminal. In addition, since the present embodiment describes an embodiment using a MOSFET as an exemplary power transistor, the lead 30 and the die pad 20 operate as the drain terminal of semiconductor device PKG1 on the circuitry. When a IGBT is used for the power transistor as modified example, a collector-electrode is formed on the back surface of the semiconductor chip. Therefore, when the power transistor is IGBT, the lead 30 and the die pad 20 operate as semiconductor device PKG1 collectors on the circuitry.

Further, as shown in FIG. 5, the plurality of side surface of the die pad 20 include side surface 20s1 which are provided facing the respective leads 30 in a plan view and are sealed by the sealing body 40. The plurality of side surface includes a side surface 20s2 provided on the other side of the side surface 20s1, exposed from the sealing body 40, and covered with the metallic film 22 (see FIG. 6).

Further, as shown in FIGS. 4 and 6, the lower surface 20b of the die pad 20 is exposed from the sealing body 40 on the lower surface 40b of the sealing body 40. In the embodiment shown in FIG. 4, the area of the lower surface 20b of the die pad 20 is equal to or larger than the area of the lower surface 40b of the encapsulant 40. Further, as shown in FIG. 3, a portion of the die pad 20 protrudes outward from a side surface of one of the plurality of side surface 40s included in the sealing body 40 in a plan view viewed from upper surface of the die pad 20. As shown in FIGS. 3 and 6, a portion of upper surface 20t of the die pad 20 and a portion (at least a side surface 20s2) of the plurality of side surface 20s are exposed from the sealing body 40. As in the present embodiment, the die pad 20 is made larger in plane size and a part of the die pad 20 is exposed from the sealing body 40, such that the heat dissipation efficiency of the heat generated in the semiconductor chip 10 can be improved. Note that, although not shown, the lower surface 20b of the die pad 20 may not be exposed from the encapsulant 40 as a modified example to the present embodiment. In addition, as another modified example, only a portion of the die pad 20 may be exposed from the sealing body 40, and other portions may be sealed to the sealing body 40.

The die pad 20 has a base material 21 made of the same metallic material as the plurality of leads 30, for example, copper (Cu) or an alloying material mainly composed of copper (Cu). Further, each of the plurality of leads 30 has a base material 31 made of the same metallic material as the die pad for example, copper (Cu) or an alloying material containing copper (Cu) as a main component of.

In the die pad 20, a portion (an outer portion and an exposed portion) exposed from the sealing body 40 is covered with the metal film 22. Similarly, a part of the lead 30 exposed from the sealing body 40 (the outer part 30X) is covered with the metallic film 32. The metal film 22 and the metal film 32 are metal films for improving wettability of a solder material used as a connecting material when a semiconductor device PKG1 is mounted on a mounting substrate. The metal film 22 and the metal film 32 are, for example, plated metal films formed by an electrolytic plating method. As will be described later, the metal film 22 and the metal film 32 are made of, for example, a solder material containing tin (Sn).

Further, the die bonding material (adhesive material) 11 shown in FIGS. 5 and 6 is a conductive member (die bonding material) for fixing the semiconductor chip 10 on the die pad and electrically connecting the semiconductor chip 10 and the die pad 20. For example, a solder material may be used as the die bonding material 11. Alternatively, the die-bonding material 11 may be a conductive resin-adhesive material called silver (Ag) paste, which contains a plurality of silver (Ag) particles (fillers). Although not shown, a metallic film (not shown) having high adhesion to the die bonding material 11 than copper (Cu) or copper alloy, which is a base material of the die pad 20, may be formed on a part of upper surface 20t of the die pad 20. In this case, the bonding strength between the die bonding material 11 and the die pad 20 can be improved.

As shown in FIG. 5, the gate pad (gate electrode pad) GE and the lead 30G of the semiconductor chip 10 are electrically connected via a wire 12 (specifically, a wire (gate wire) 12G). On the other hand, the source pad SE and the lead 30S of the semiconductor chip 10 are electrically connected via a wire 12 (specifically, a wire (source wire) 12S) and a wire 12S. The wire 12 is a conductive member (metallic wire) that connects the electrode pad on the front 10t of the semiconductor chip 10 and the lead 30, and includes, for example, Al as a main component. Note that there are various modified example as constituent materials of the wire 12, and metallic materials such as copper (Cu), silver (Ag), or gold (Au) may be used as main components.

As shown in FIG. 5, one end of the wire 12G is bonded to the gate pad GE of the semiconductor chip 10. On the other end hand, the other end of the wire 12G opposite to the one end is bonded to an upper surface 30t of a lead bonding portion (lead post, bonding pad) 30W formed in a part of the lead 30G.

On the other hand, as shown in FIGS. 5 and 6, a wire 12S is bonded to the source pad SE. One end of the wire 12S is bonded to a wire 12S bonded to the source pad SE of the semiconductor chip 10. The other end of the wire 12S opposite the one end is bonded to the upper surface 30t of a lead-bonding portion 30W formed in a part of the lead 30S.

In the power semiconductor device, a larger current flows in a wiring path (power supply path) connected to the source pad SE than in a wiring path (power supply path) connected to the gate pad GE. Therefore, in the present embodiment, a wire 12S is interposed between the wire 12 and the source pad SE from the viewpoint of reducing the ON-resistance in the power supplying path including the source pad SE. The reason why the ON-resistance of the power-supply path including the source pad SE can be reduced by providing the wire 12S will be described later. The gate pad GE and the lead 30G are electrically connected to each other without passing through the wire 12S because the power path connected to the gate pad SE has a smaller current flow than the power supply path including the source pad GE.

In the embodiment shown in FIG. 5, the thickness of the wire 12S is larger than the thickness of the wire 12G. Note that the shape and the number of the wire 12 are not limited to the embodiment shown in FIG. 5, and there are various modified example. For example, the wire 12G and the wire 12S may have the same thickness. Further, for example, the source pad SE and the lead 30S may be electrically connected to each other via a plurality of wire 12S. In the present embodiment, a plurality of wire 12S are connected to the source pad SE of the semiconductor chip 10.

Further, the semiconductor chip 10, the plurality of leads 30, and the plurality of wires 12 are sealed by the sealing body 40. The sealing body 40 is a plastic member that seals the semiconductor chip 10, the wire 12S, and the plurality of wires 12. The sealing body 40 has the upper surface 40t (see FIGS. 3 and 6) and a lower surface (mounting surface) 40b (see FIGS. 4 and 6) located on the other side of upper surface 40t. As shown in FIGS. 3 and 4, each of upper surface 40t (refer to FIG. 3) and the lower surface 40b (see FIG. 4) of the sealing body 40 has a plurality of side surface 40s in the peripheral portion. The sealing body 40 is mainly made of a thermosetting resin such as an epoxy resin, for example. In the present embodiment, for example, filler particles such as silica (silicon dioxide; SiO2) particles are mixed in the resin material in order to improve the characteristic of the sealing body 40 (for example, expansion properties due to thermal effects).

<Details of Connecting Portion of Wire and Electrode Pad>

Figure 7:
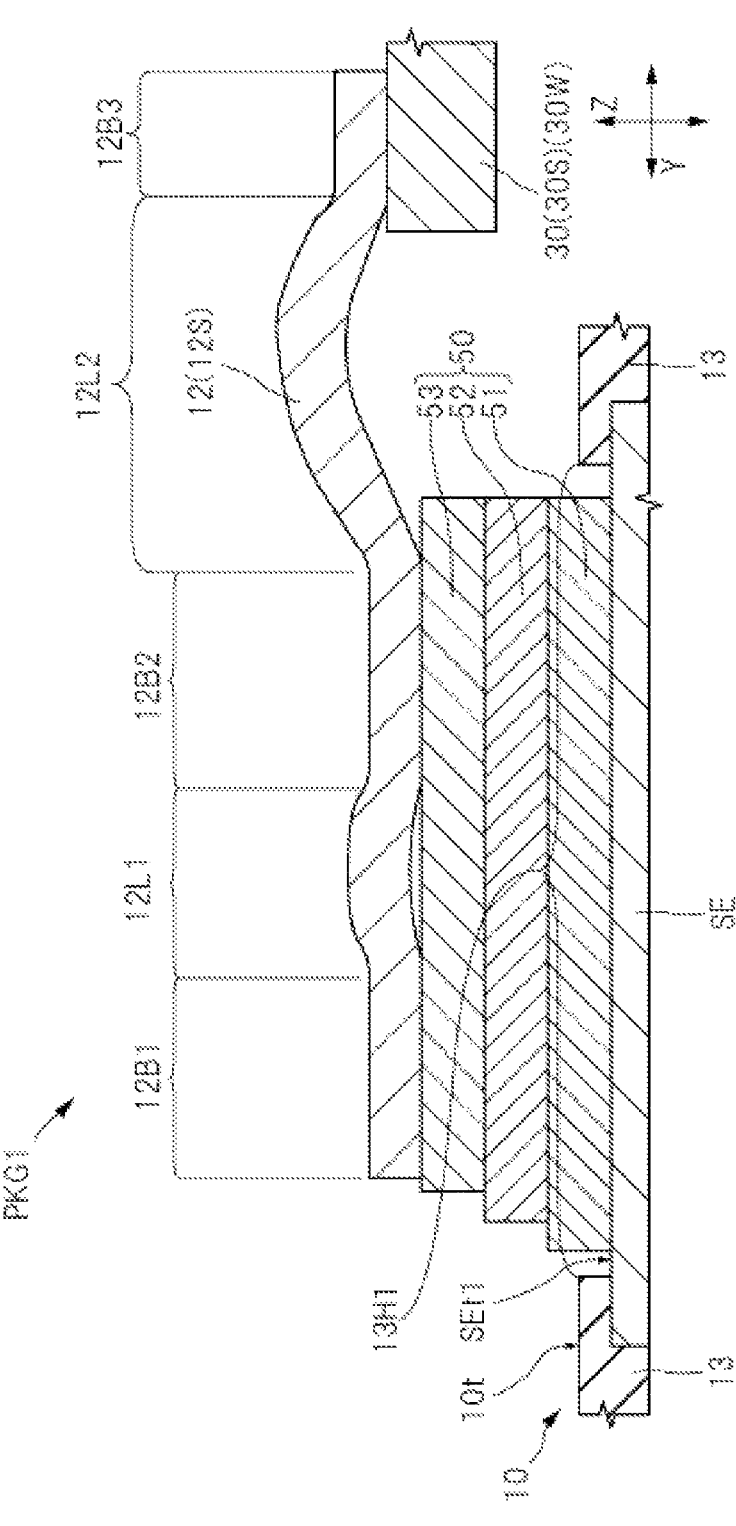
FIG. 7 is an enlarged cross-sectional view of a periphery of a connecting portion between a source pad and a wire shown in FIG. 6.
Figure 8:
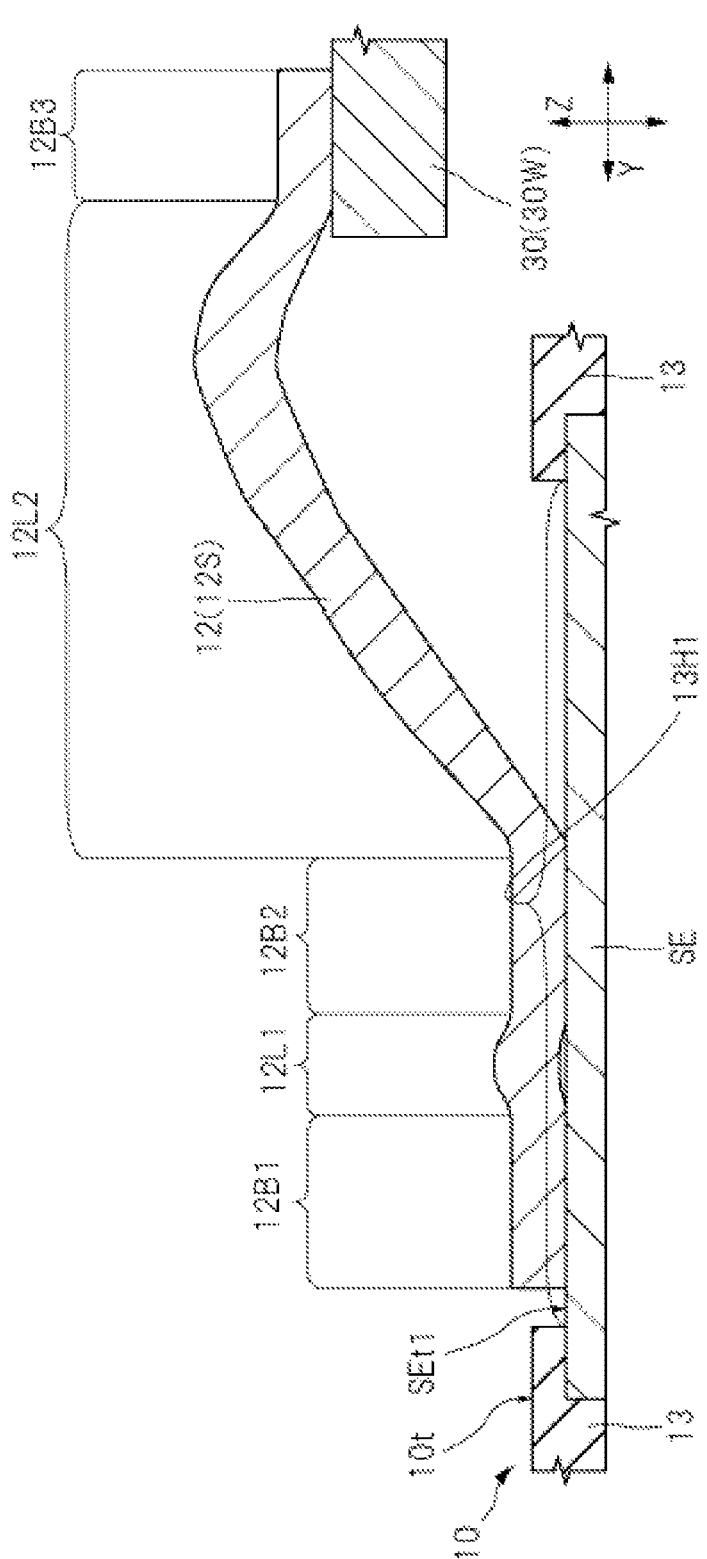
FIG. 8 is an enlarged cross-sectional view showing an examined example with respect to FIG. 7.
Figure 9:
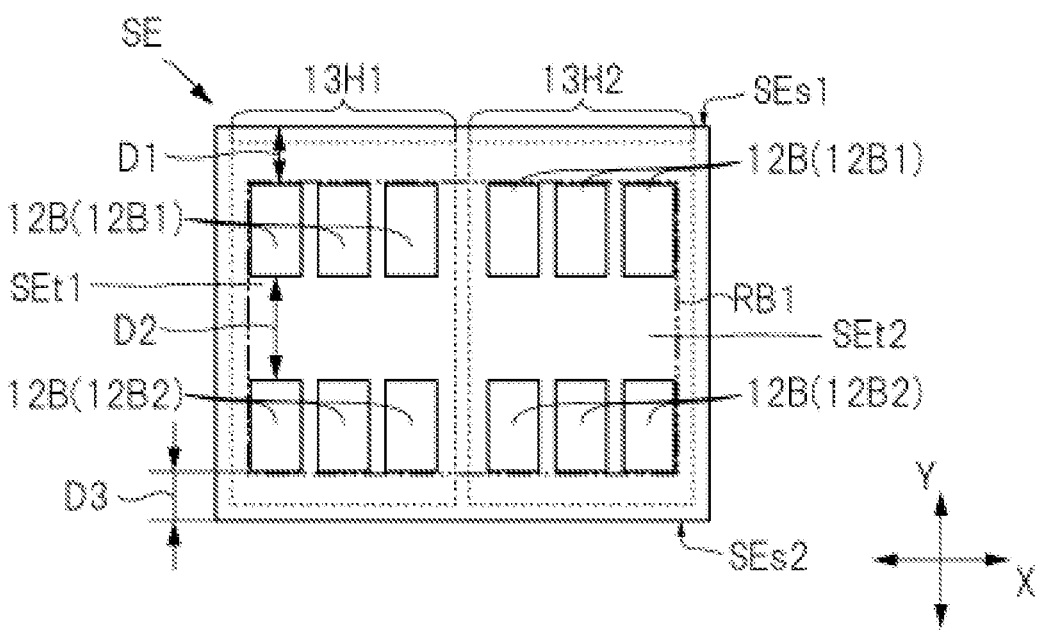
FIG. 9 is an explanatory view schematically showing a positional relationship, in plan view, between a source pad and a plurality of connecting portions.
Figure 10:
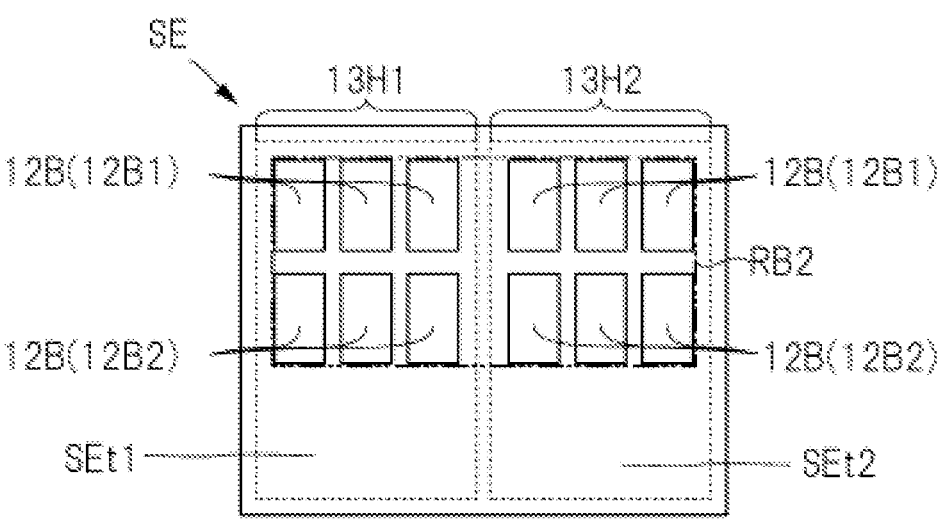
FIG. 10 is an explanatory view showing a modified example with respect to FIG. 9.

Next, a detailed description will be given of a portion of the semiconductor chip where the electrode pad and the wire are connected to each other. FIG. 7 is an enlarged cross-sectional view of a periphery of a connecting portion between a source pad and a wire shown in FIG. 6. FIG. 8 is an enlarged cross-sectional view showing an examined example with respect to FIG. 7. FIG. 9 and FIG. 10 are an explanatory view schematically showing a positional relationship, in plan view, between a source pad and a plurality of connecting portions. In FIG. 9, the wire 12S shown in FIG. 7 is not shown, but FIG. 9 corresponds to the positional relation between the connecting portion 12B1 and the connecting portion 12B2 of the wire 12S shown in FIG. 7 and the source pad SE. FIG. 10 corresponds to the positional relation between the connecting portion 12B1 and the connecting portion 12B2 of the wire 12S shown in FIG. 8 and the source pad SE.

First, a detailed description will be given of a portion for electrically connecting the electrode pad and the wire using the wire connecting model shown in FIG. 8 which is an examined example. The example shown in FIG. 8 differs from the example of the present embodiment shown in FIG. 7 in that the wire 12 is directly connected to the source-pad SE.

As shown in FIG. 8, an insulating film 13 is formed on the front 10t of the semiconductor chip 10. The insulating film 13 is a protective film that protects the front 10t of the semiconductor chip 10. The insulating film 13 may be, for example, an organic film made of an organic material such as polyimide resin or an inorganic insulating film made of silicon dioxide (SiO2) or silicon nitride (SiN).

A plurality of openings is formed in the insulating film 13. FIG. 8 illustrates an opening portion 13H1 in which a portion of the source pad SE among the plurality of opening portions is exposed from the insulating film 13. In addition to the opening portion 13H1 shown in FIG. 8, the plurality of openings of the insulating film 13 include openings that expose the gate pad GE shown in FIG. 5. As shown in FIGS. 9 and 10, in the present embodiment, the plurality of opening portions of the insulating film 13 (refer to FIG. 8) includes an opening portion 13H2 exposing another portion of the source pad SE.

As shown in FIG. 8, in the opening portion 13H1, a bonding surface (exposed surface, bonding portion) SEt1 which is a part of the source pad SE is exposed from the insulating film 13. A wire (source wire) 12S is bonded to the bonding surface SEt1. The wire 12S has a connecting portion (stitching portion, portion) bonded to the bonding surface SEt1, a connecting portion (stitching portion, portion) 12B2 joined to the bonding surface SEt1, and a looping portion 12L1 positioned between the connecting portion 12B1 and the connecting portion 12B2 in the Y direction in a plan view. Each of the connecting portion 12B1 and the connecting portion 12B2 is a portion bonded to the electrode pad of the semiconductor chip 10 by using an ultrasonic wave, and the lower surface of the connecting portion 12B1 and the connecting portion 12B2 are bonded to the same bonding surface SEt1. Further, the looped portion 12L1 is a portion connecting the connecting portion 12B1 and the connecting portion 12B2, and is spaced apart from the bonding surface SEt1. In addition, the wire 12S has a connecting portion (joining portion, stitching portion) 12B3 which is a portion bonded to the lead-bonding portion 30W of the lead 30S shown in FIG. 5. Further, the wire 12S is located between the connecting portion 12B2 and the connecting portion 12B3 (refer to FIG. 5) shown in FIG. 7, and has a looped portion 12L2 for connecting the connecting portion 12B2 and the connecting portion 12B3.

As will be described later, in the example shown in FIG. 8, the wire 12 is bonded by a so-called forward bonding method in which a connection portion with the source pad SE is a first bond and a connection portion with the lead 30 is a second bond. In order to prevent the guides for supplying the wires from interfering with the leads 30 among the bonders for wire bonding, the distance of the looped portion 12L2 in the Y direction must be increased. Consequently, as shown in FIG. 8, the connecting portion 12B1 and the connecting portion 12B2 are disposed at positions far from the distal end of the lead 30. Incidentally, although not shown, the connection portion with the lead 30 is a first bond, the connection portion with the source pad SE is a second bond, so-called in the reverse bonding method, it is possible to avoid interference between the lead and the lead 30 as described later. However, when the height difference between the lead 30 and the source pad SE is large, disconnection of the wire 12 due to the steep inclination angle of the looped portion 12L2 needs to be avoided. Therefore, in the reverse-bonding method as well, the connecting portion 12B1 and the connecting portion 12B2 are disposed at positions far from the distal end of the lead 30, similarly to the embodiment shown in FIG. 8.

If the reverse bonding method is adopted in the embodiment shown in FIG. 8 and the position of the second bond is a position close to the lead 30 on the source pad SE shown in FIG. 8, the slope of the looped portion 12L2 becomes steep. In this case, even if the wire is not broken immediately after being joined, there is a risk of the wire being broken in a sealing step to be described later. Alternatively, even if disconnection does not occur in the sealing process, disconnection may occur due to continuous current application during continuous use as a product. Therefore, when the wire 12 is directly bonded on the source pad SE as shown in FIG. 8, the connecting portion 12B1 and the connecting portion 12B2 of the wire 12 are disposed at a position far from the distal end of the lead 30.

Here, the inventor of the present application has studied the preferable positional relation between the connection portion of the wire and the source pad SE from the viewpoint of reducing the resistance (hereinafter, referred to as ON-resistance) at the electric connection part between the wire 12 and the source pad SE. As a result of this examination, the following were proven.

First, the ON-resistance can be reduced by increasing the junction area between the wire 12 and the source-pad SE. In other words, the ON-resistance can be reduced by increasing the number of connecting portions 12B (see FIG. 9) of the wire 12 connected to the source pad SE. For example, since the number of the connecting portions 12B increases, the ON-resistance can be reduced if the number of wires connected to one source pad SE increases when the bonding area of each of the plurality of connecting portions 12B shown in FIGS. 9 and 10 is the same. As will be described later as modified example, replacing the wire 12 with a ribbon, which is a strip-shaped conductive member, is also an efficient way to reduce the ON-resistance.

Second, when the number of connecting portions (the size of the bonding area) is the same, the ON-resistance can be reduced in proportion to the area of the region connecting all the connecting portions. For example, in the embodiment shown in FIG. 9, six connecting portions 12B are provided along the peripheral edge portion of the source pad SE. On the other hand, in the embodiment shown in FIG. 10, six connecting portions 12B are collectively arranged on a portion (upper side) of the source pad SE. The area of the region RB1 connecting the outer edges of the six connecting portions 12B shown in FIG. 9 is larger than the area of the region RB2 connecting the outer edges of the six connecting portions 12B shown in FIG. 10. According to studies by the inventors of the present application, when comparing the example shown in FIG. 9 with the example shown in FIG. 10, it was found that the ON-resistance is lower in the example shown in FIG. 9. This is considered to be because the entire source pad SE can be effectively utilized as a current path by widely distributing the connecting portion 12B.

The source pad SE is, for example, a quadrangle, and has a side SEs1 extending along a direction (X direction in FIG. 9) intersecting the arrangement direction (Y direction in FIG. 9) of the connecting portion 12B1 and the connecting portion 12B2, and a side SEs2 located opposite to the side SEs1 and extending in the X direction. In this case, from the viewpoint of reducing the ON-resistance, the following aspects are preferable. That is, the distance 12B1 from the connecting portion to the side SEs1 is shorter than the distance (separation distance) D2 between the connecting portion 12B1 and the connecting portion 12B2, and is shorter than the distance D1 between the connecting portion 12B1 and the connecting portion 12B2 in the distance D3 from the connecting portion 12B2 to the side SEs2. In this case, since the area of the area RB1 connecting the plurality of connecting portions 12B can be increased, the ON-resistance can be reduced.

The wire 12S and the source pad SE shown in FIG. 7 will be described below. The source pad SE included in semiconductor device PKG1 is located at a position below the lead 30S. In the semiconductor device PKG1, each of the connecting portion 12B1 and the connecting portion 12B2 of the wire 12 is bonded to a ribbon (strip-shaped conductive member) 53 composing the conductive member 50 bonded on the source pad SE. Due to the total thickness of the conductive member 50 (or the thickness of the ribbons 51 to 53 composing the conductive member 50), the difference in height between the lead-bonding portion 30W of the lead 30 and the connecting portion 12B2 of the wire 12S can be reduced. Therefore, even when the wire 12S is connected by the forward bonding method in the bonding step of the lead to be described later, it is possible to prevent the lead 30 from interfering with the bonder. In addition, in the step of bonding the wire 12S to the source pad SE, the wire 12S can be disposed in the vicinity of the lead 30 because the lead and the bonder for the wire 12S can be prevented from interfering with each other by adopting the reverse bonding method. Consequently, as shown in FIG. 9, the area of the area RB1 where the plurality of connecting portions 12B are connected can be increased in a plan view, such that the ON-resistance can be reduced.

In FIG. 7, the conductive member 50 includes a ribbon (strip-shaped conductive member) 51, a ribbon (strip-shaped conductive member) 52, and a ribbon (strip-shaped conductive member) 53 that are electrically conductive and stacked on the source-pad SE. However, there are various modified example for the number and thickness of the ribbon composing the conductive member 50. For example, when one ribbon 51 can prevent the bonder and the lead from interfering with each other in the lead bonding process, a wire 12S may be formed by one ribbon 51. In addition, depending on the difference in height between the lead joint 30W of the lead 30 and the source pad SE, the conductive member 50 may be formed of two ribbons or may be formed of four or more ribbons.

<Method of Manufacturing Semiconductor Device>

Figure 11:
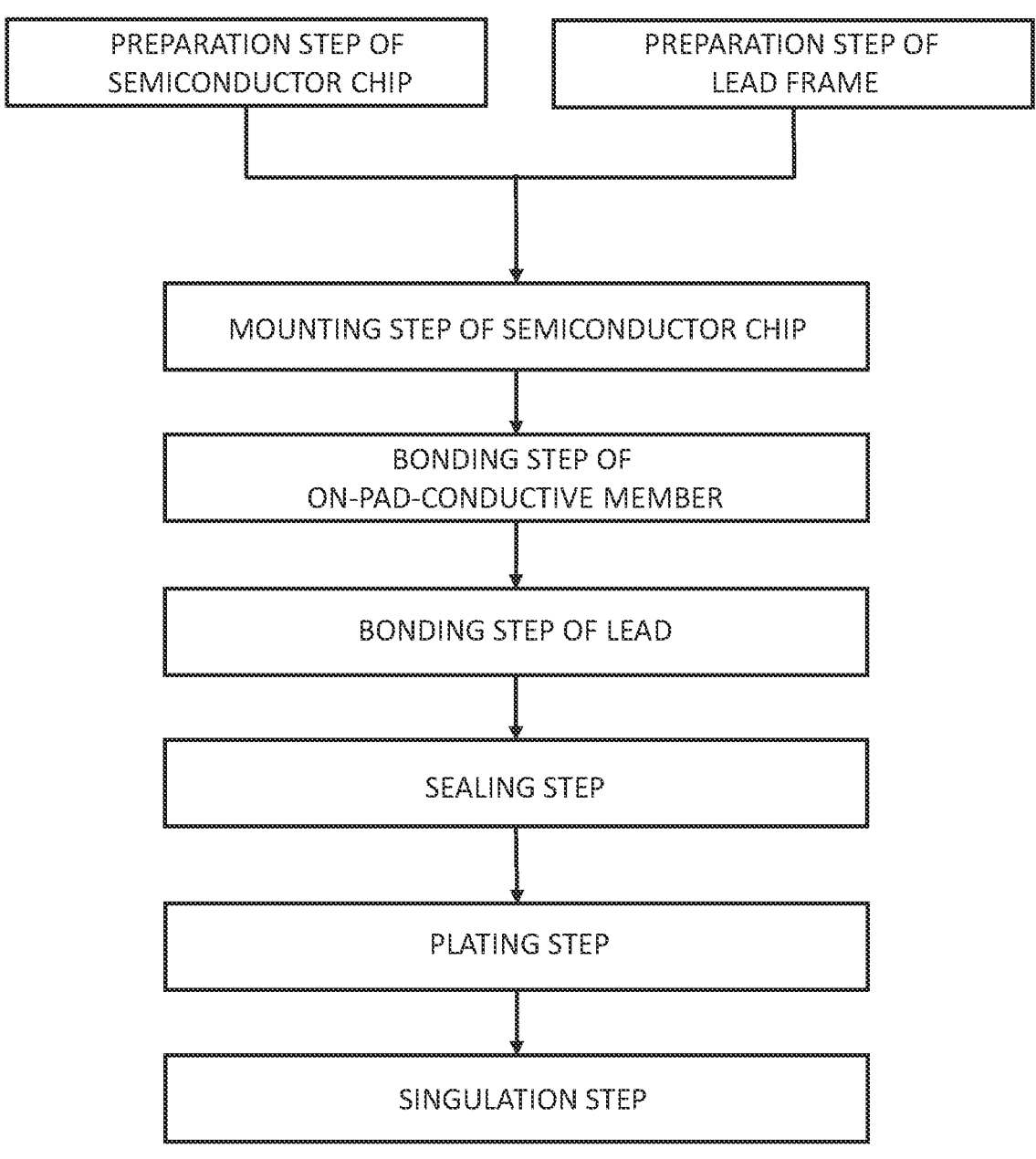
FIG. 11 is an explanatory view showing an outline of a manufacturing process of the semiconductor device explained by referring to FIGS. 1 to 10.

Next, the manufacturing process of the semiconductor device PKG1 described with reference to FIGS. 1 to 10 will be described. The semiconductor device PKG1 is manufactured according to the process shown in FIG. 11. FIG. 11 is an explanatory view showing an outline of a manufacturing process of the semiconductor device explained by referring to FIGS. 1 to 10. In the following description, the components of the semiconductor device PKG1 will be described referring to FIGS. 1 to 10 as needed.

<Preparation of Semiconductor Chip>

In the preparation step of the semiconductor chip shown in FIG. 11, the semiconductor chip 10 described with reference to FIGS. 5 and 6 is prepared. As described above with reference to FIG. 2 and the like, the semiconductor chip 10 has a source pad SE electrically connected to a MOSFET (the transistor Q1 shown in FIGS. 1 and 2) and a source of a MOSFET (the source area SR shown in FIG. 2).

The semiconductor chip 10 prepared in this step has a front 10t in which a source pad (electrode) SE partially exposed from the insulating film 13 (refer to FIGS. 7 and 9) and the insulating film 13 is formed. The source pad SE has a bonding surface SEt1 (see FIG. 9) exposed from the insulating film 13 in an opening portion 13H1 (see FIG. 9) formed in the insulating film 13, and a bonding surface SEt2 (see FIG. 9) exposed from the insulating film 13 in an opening portion 13H2 (see FIG. 9) formed in the insulating film 13.

As shown in FIG. 5, a gate pad (electrode) GE is formed on the front 10t of the semiconductor chip 10. The gate pad GE has a bonding surface (bonding surface GEt in FIG. 13 to be described later) exposed from the insulating film in an opening portion (opening portion 13H3 in FIG. 13 to be described later) formed in the insulating film 13 (see FIG. 7). In addition, as shown in FIG. 6, the semiconductor chip has a back surface 10b opposite away from the front surface 10t. A drain electrode DE electrically connected to the drain D (see FIG. 1) is formed on the back surface 10b of the semiconductor chip 10. In the embodiment shown in FIG. 6, the entire back surface 10b of the semiconductor chip 10 is the drain-electrode DE.

The semiconductor chip 10 is manufactured, for example, as follows. For example, a semiconductor wafer (not shown) on which an n− type epitaxial layer EP is formed is prepared on a main surface WHt (refer to FIG. 2) of a semiconductor substrate WH (see FIG. 2) made of n type monocrystalline silicon, and a plurality of transistor Q1 are formed on the epitaxial layer EP. The semiconductor wafer includes a plurality of chip regions, and a plurality of transistors Q1 are formed for each of the plurality of chip regions. Further, a source pad SE and a gate pad GE are formed on the transistor Q1. The source pad SE is connected to the plurality of source regions SR, and the gate pad GE is connected to the plurality of gates (gate electrodes) G. Next, an insulating film 13 (see FIG. 7) is formed so as to cover the entire of the source pad SE and the gate pad GE. Thereafter, an opening portion 13H1 (see FIG. 9), a 13H2 (see FIG. 9), and an opening for a gate pad (an opening portion 13H3 of FIG. 13 to be described later) are formed in the insulating film 13, and a portion of the source pad SE (bonding surface SEt1, SEt2) and a portion of the gate pad GE (a bonding surface GEt of FIG. 13 to be described later) are exposed from the insulating film 13. Thereafter, a necessary test (wafer test) such as an electrical test on the circuit is performed, and then the wafer is divided into a plurality of semiconductor chips 10. Note that, as the drain electrode DE shown in FIG. 6, when the metal film is formed on the back surface 10*b*, the metal film used as the drain electrode DE is formed at any timing during the step of dividing the semiconductor wafer from the step of preparing the semiconductor wafer. If a metallic film is not used as the drain-electrode DE, this step can be omitted.

<Preparation of Lead Frame>

Figure 12:
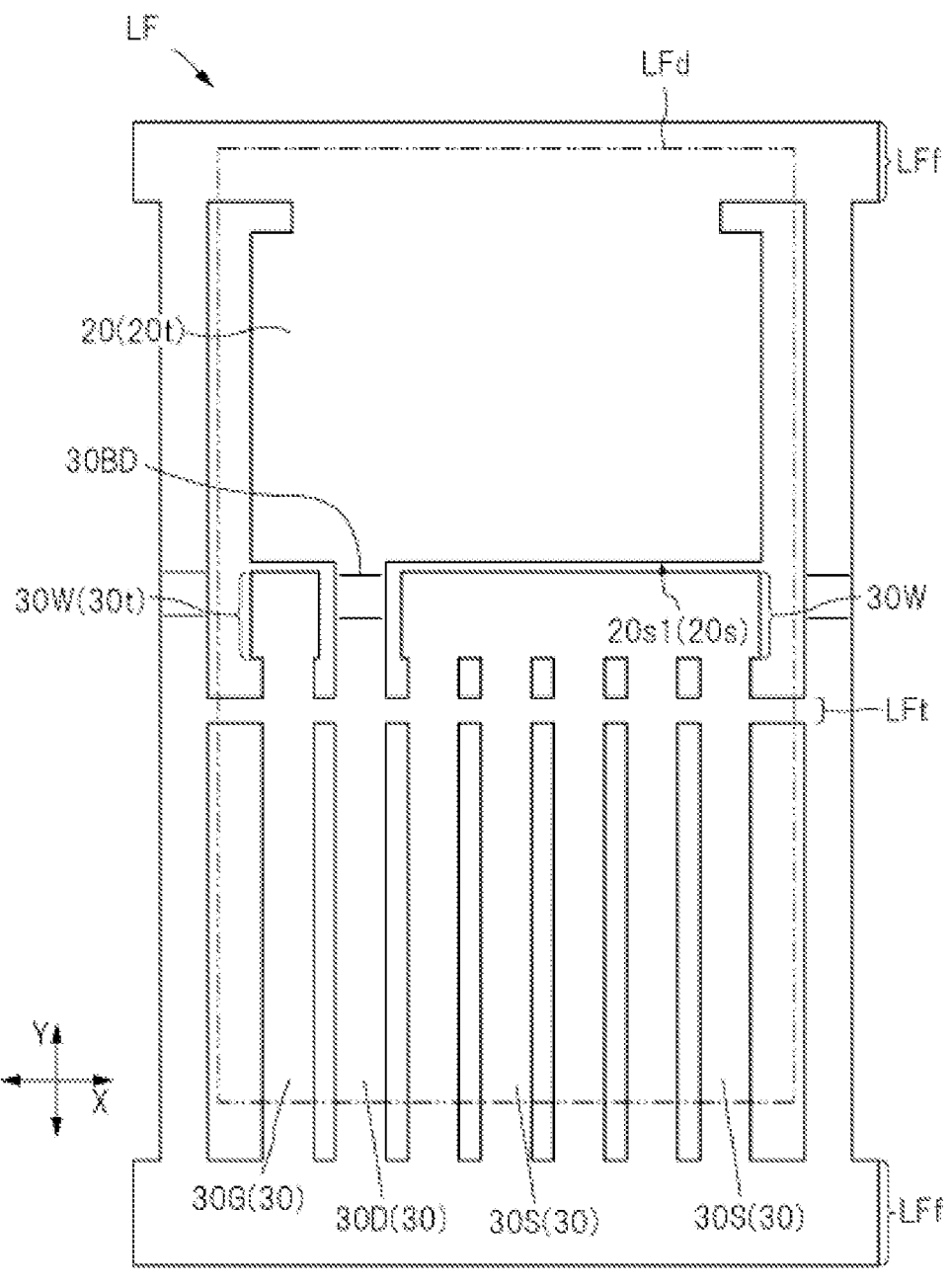
FIG. 12 is an enlarged plan view showing a portion of a lead frame provided in a lead-frame preparation step shown in FIG. 11.

In the preparing step of the lead frame shown in FIG. 11, the lead frame LF shown in FIG. 12 is provided. FIG. 12 is an enlarged plan view showing a portion of a lead frame provided in a lead-frame preparation step shown in FIG. 11.

As shown in FIG. 12, the lead frame LF prepared in this step includes a device-forming portion LFd connected to a frame portion LFf. One device-forming unit LFd corresponds to one semiconductor device PKG1 shown in FIG. 5. In FIG. 12, one device forming portion LFd is shown, but the lead frame LF includes a plurality of device forming portions LFd connected via a frame portion LFf. As described above, by using the lead frame LF including the plurality of forming portion units LFd, a plurality of semiconductor device PKG1 (refer to the former FIG. 3) can be manufactured collectively, and thus the manufacturing efficiency can be improved.

The lead frame LF is made of, for example, copper (Cu) as a main component. Each of the plurality of device-forming portions LFd is connected to the frame portion LFf. The frame portion LFf is a support portion that supports the respective members formed in the device-forming portion LFd until the lead separating step shown in FIG. 11. In the present embodiment, for example, the thickness of the lead 30 (the distance from upper surface 30*t* to the lower surface 30*b*) is about 0.4 mm to 0.6 mm, and the thickness of the die pad 20 (the distance from upper surface 20*t* to the lower surface 20*b*) is about 0.5 mm to 1.3 mm.

As shown in FIG. 12, a die pad 20 and a plurality of leads 30 are formed on the device-forming portion LFd. The die pad 20 is connected to the frame portion LFf via a lead 30D functioning as the suspension lead among the plurality of leads and is supported by the frame portion LFf. The die pad 20 includes the upper surface 20*t* that is a chip-mounting surface.

Further, the plurality of leads 30 is respectively connected to the frame portion LFf and supported by the frame portion LFf. Each of the plurality of leads 30 extends along the Y direction and is arranged side by side so as to be adjacent to each other in the X direction. Each of the plurality of leads 30 is connected to each other via a tie bar LFt.

The plurality of leads 30 includes a plurality of lead 30S that are source-use leads. Each of the plurality of lead is arranged adjacent to each other in the X direction, and is connected to the lead joint 30W. Further, the plurality of leads 30 includes a lead 30G which is a gate-use lead. The lead-bonding portion 30W is provided at a distal end portion of the lead 30G on the die pad 20 side. Further, the plurality of leads 30 includes a lead 30D which is a lead for draining. The lead 30D is disposed between the lead 30G and the lead 30S in the X direction, and the leading end of the die pad 20 in the Y direction is connected to the die pad 20.

In the present embodiment, upper surface 20*t* of the die pad 20 is positioned at a height that differs from upper surface 30*t* of the lead joint 30W of the lead 30. A lead 30D as the suspension lead supporting the die pad 20 and a part connecting the die pad 20 and the frame portion LFf are subjected to bending, and the die pad 20 is offset. In the present embodiment, the die pad 20 is down-set with respect to other members of the lead frame LF. Therefore, as shown in FIG. 6, the upper surface 20*t* of the die pad 20 is disposed below the upper surface 30*t* of the lead 30S. In other words, the lead 30D as the suspension lead has a bent portion 30BD subjected to a bending process such that the die pad 20 is located at a position below the lead 30S in a cross-sectional view. By down-setting the die pad 20 in this manner, the lower surface 20*b* of the die pad 20 is exposed from the encapsulant as shown in FIG. 6.

<Mounting Step of Semiconductor Chip>

Figure 13:
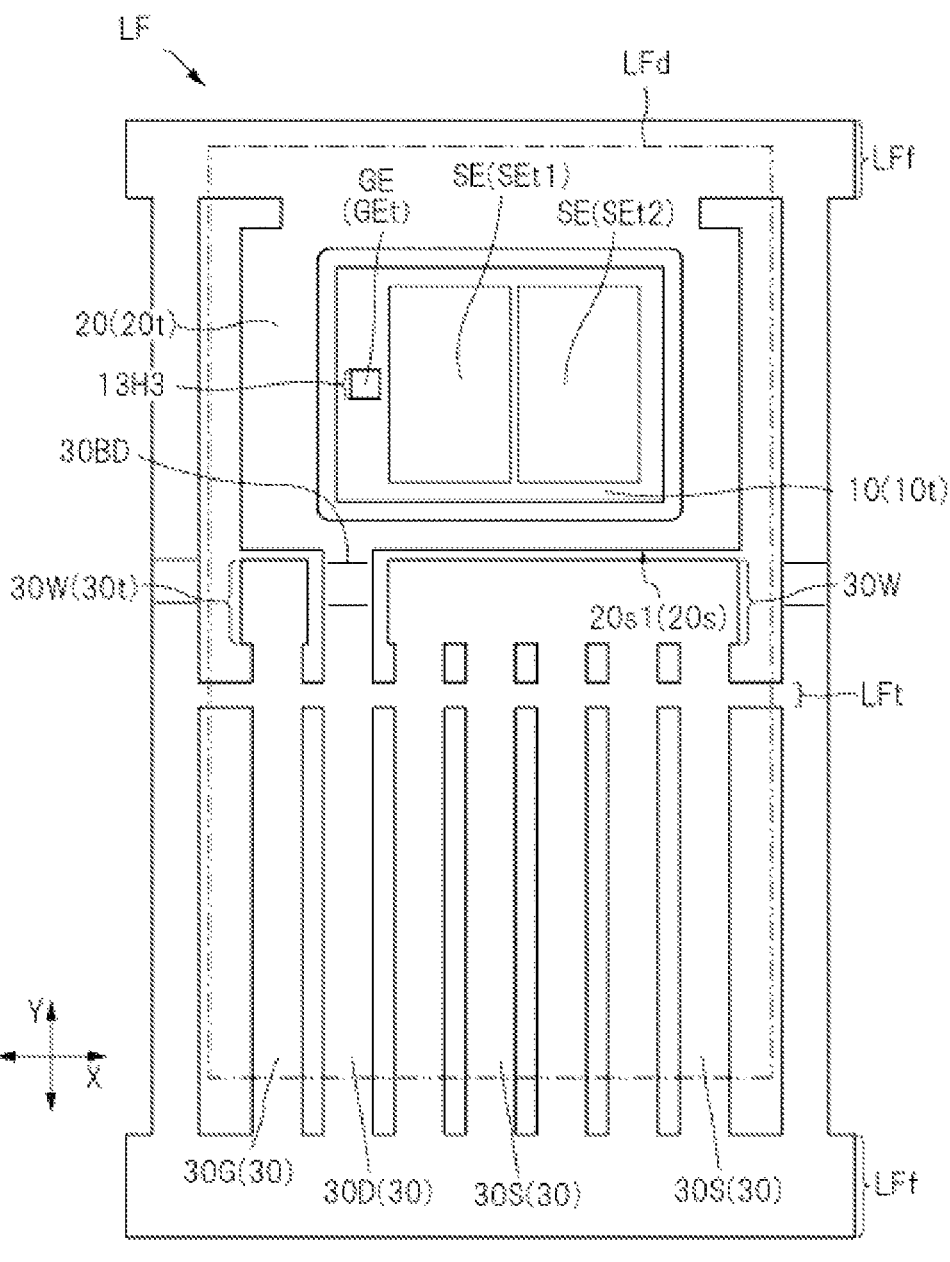
FIG. 13 is an enlarged plan view showing a state that a semiconductor chip is mounted on the die pad shown in FIG. 12.

Next, in the mounting step of the semiconductor chip shown in FIG. 11, as shown in FIG. 13, the semiconductor chip 10 is mounted on the die pad 20 on the lead frame LF. FIG. 13 is an enlarged plan view showing a state that a semiconductor chip is mounted on the die pad shown in FIG. 12.

In this step, the semiconductor chip 10 is mounted (adhesively fixed) on the upper surface 20*t* of the die pad 20 via the die bonding material 11. Further, in the semiconductor chip 10, the back surface 10*b* (see FIG. 6) on which the drain electrode DE (see FIG. 6) is formed is bonded and fixed via the die bonding material 11 so as to face the upper surface which is the chip mounting surface of the die pad 20. Accordingly, the drain electrode DE of the semiconductor chip is electrically connected to the die pad 20 via the die bonding material 11 which is a conductive connecting material.

In this step, after the die bonding material 11 is applied on upper surface 20*t* of the die pad 20, the die bonding material 11 is disposed with the semiconducting chip 10. Then, the semiconductor chip 10 and the die pad 20 are fixed by curing the die bonding material.

For example, a solder material may be used as the die bonding material 11. Alternatively, the die-bonding material 11 may be a conductive resin-adhesive material called silver (Ag) paste, which contains a plurality of silver (Ag) particles (fillers). When the die bonding material 11 is a solder material, a reflow process is performed as a method of curing the die bonding material. When the die bonding material 11 is a conductive resin adhesive material, the thermosetting resin component contained in the die bonding material 11 is heated and cured.

<Bonding Step of on-Pad-Conductive Member>

Figure 14:
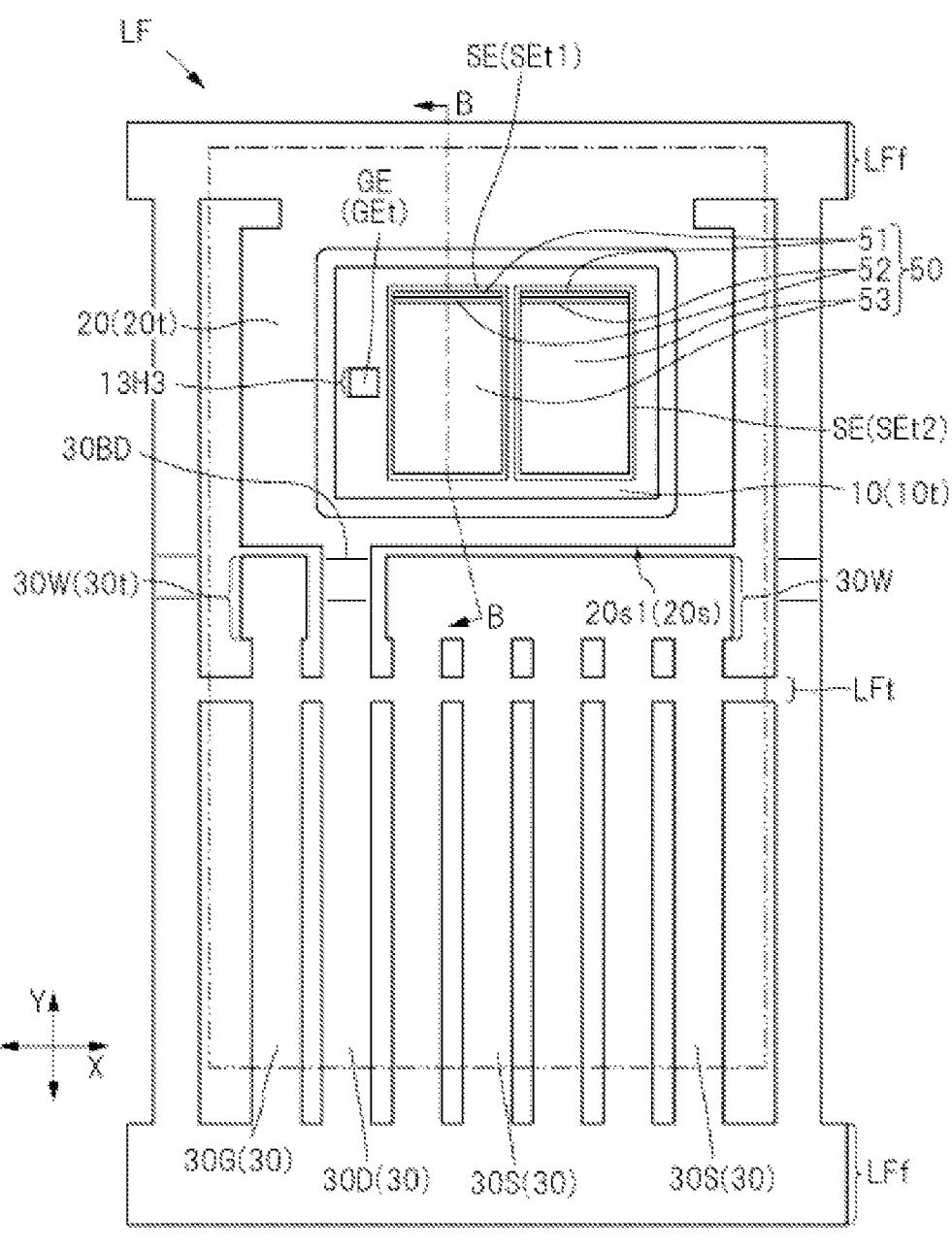
FIG. 14 is an enlarged plan view showing a state that a conductive member is bonded to a source pad of the semiconductor chip shown in FIG. 13.

Next, in the bonding step of the on-pad-conductive member shown in FIG. 11, FIG. 14 is an enlarged plan view showing a state that a conductive member is bonded to a source pad of the semiconductor chip shown in FIG. 13. As described above, in the cross-sectional view, the source pad SE is located at a position below the lead 30 (specifically, the lead 30S for the source). The present embodiment includes a step of bonding a wire 12S on the source pad SE to reduce the difference in height between the lead 30 and the source pad SE of the semiconductor chip 10. Hereinafter, the step of bonding the wire 12S will be described. As described above, in the present embodiment, an embodiment in which the ribbon 51, the ribbon 52, and the ribbon 53, which are strip-shaped conductive members, are joined as the wire 12S, is described, but there are various modified example in the number of laminations of the strip-shaped conductive members.

FIG. 15 to FIG. 26 are an enlarged cross-sectional view showing, for each step, a state that the conductive member is bonded by using a wedge bonder, in the bonding step of the on-pad-conductive member shown in FIG. 11. In this step, the bonding step is performed by using a bonder (wedge bonder) 70 shown in FIGS. 15 to 26. As shown in FIG. 14, when two portions of the bonding surface SEt1 and the bonding surface SEt2 are present as the bonding surface of the source pad SE, the processes described below are performed on each of the bonding surface SEt1 and the bonding surface SEt2. In the following explanation, a step of bonding a wire 12S onto the bonding surface SEt1 will be exemplarily described.

The bonder 70 includes a cutter 71 capable of cutting a wire 12S, a guide 72 capable of supplying a wire 12S, and a wedge tool 73 located adjacent to the cutter 71 and capable of pressing a wire 12S. In the examples shown in FIGS. 15 to 26, the cutter 71 is located between the guide 72 and the wedge tool 73. However, as a modified example, a wedge tool 73 may be disposed between the guide 72 and the cutter 71.

Figure 26:
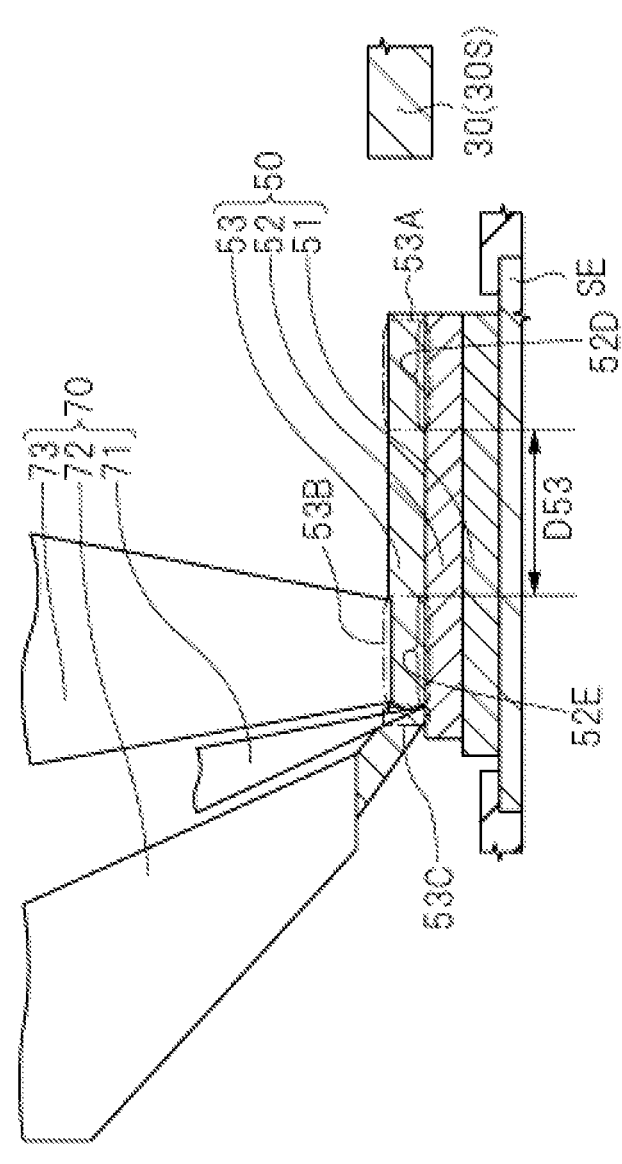
FIG. 26 is an enlarged cross-sectional view showing a state that the third ribbon is cut, following FIG. 25.

The guide 72 is a tool capable of continuously supplying a strip-shaped metallic member which is a raw material of the wire 12S. Each of the ribbon 51, the ribbon 52, and the ribbon 53 shown in FIG. 26 is sequentially unwound from the distal end of the guide 72 and is disposed on the source pad SE in accordance with the operation of the guide 72.

The wedge tool 73 is a tool that presses a leading end of the wedge tool against a bonding object (a wire 12S in the case of the present embodiment) and further applies an ultrasonic wave to the bonding object, thereby bonding the bonding object and the bonded object.

When bonding is started from a position far from the lead 30S in the bonding step of the on-pad-conductive member of the present embodiment, the lead 30 and the guide 72 may interfere with each other. This is because, when bonding is started from a position far from the lead 30S, the bonder 70 needs to be operated toward the lead 30S, and if the bonding portion and the lead 30S are too close, the guide 72 and the lead 30S collide with each other.

Figure 18:
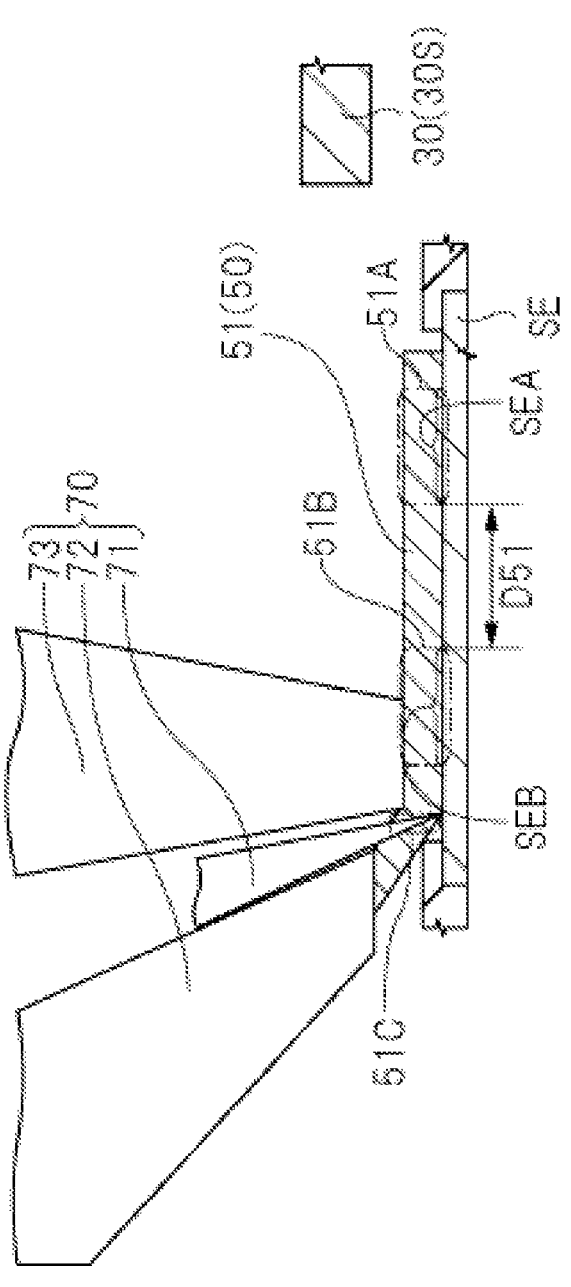
FIG. 18 is an enlarged cross-sectional view showing a state that the first ribbon is cut, following FIG. 17.
Figure 22:
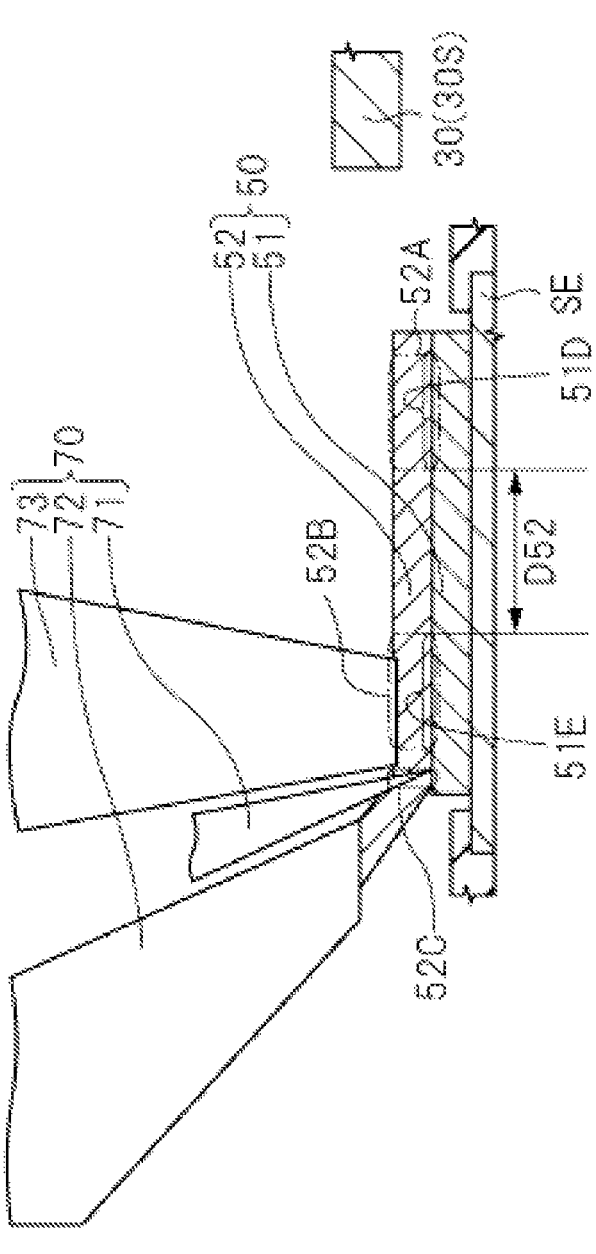
FIG. 22 is an enlarged cross-sectional view showing a state that the second ribbon is cut, following FIG. 21.

Therefore, in the present embodiment, the wire 12S is bonded by an inverse bonding method. The step of bonding the conductive member on the pad of the present embodiment includes a step of bonding the ribbon 51 to the source pad SE as shown in FIG. 18, a step of bonding the ribbon 52 on the ribbon 51 as shown in FIG. 22, and a step of bonding the ribbon 53 on the ribbon 52 as shown in FIG. 26. Hereinafter, the step of bonding the ribbons 51 arranged in the lowermost layer will be described in order.

Figure 15:
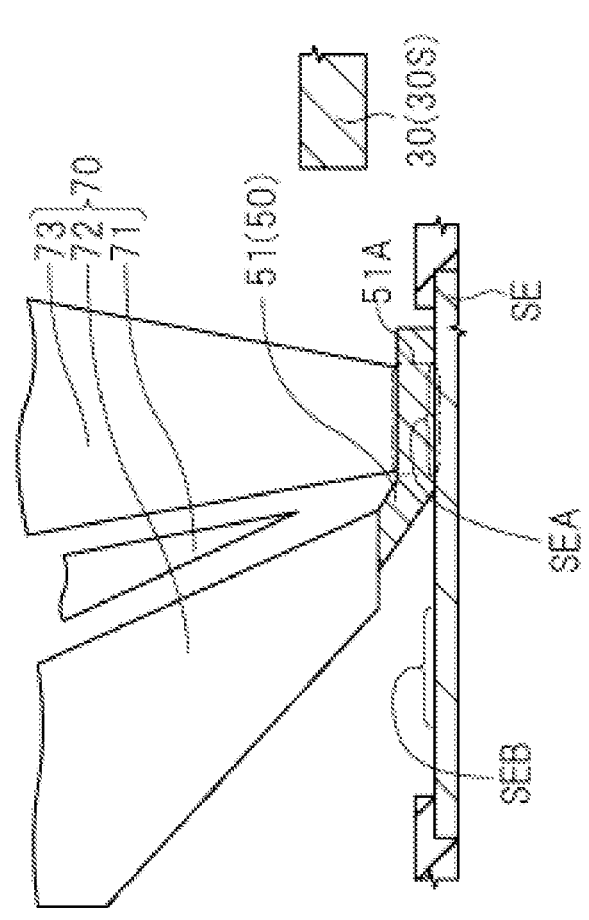
FIG. 15 is an enlarged cross-sectional view showing a state that a first ribbon is bonded to a first-pad-bonding portion of the source pad by using a wedge bonder, in a bonding step of an on-pad-conductive member shown in FIG. 11.
Figure 16:
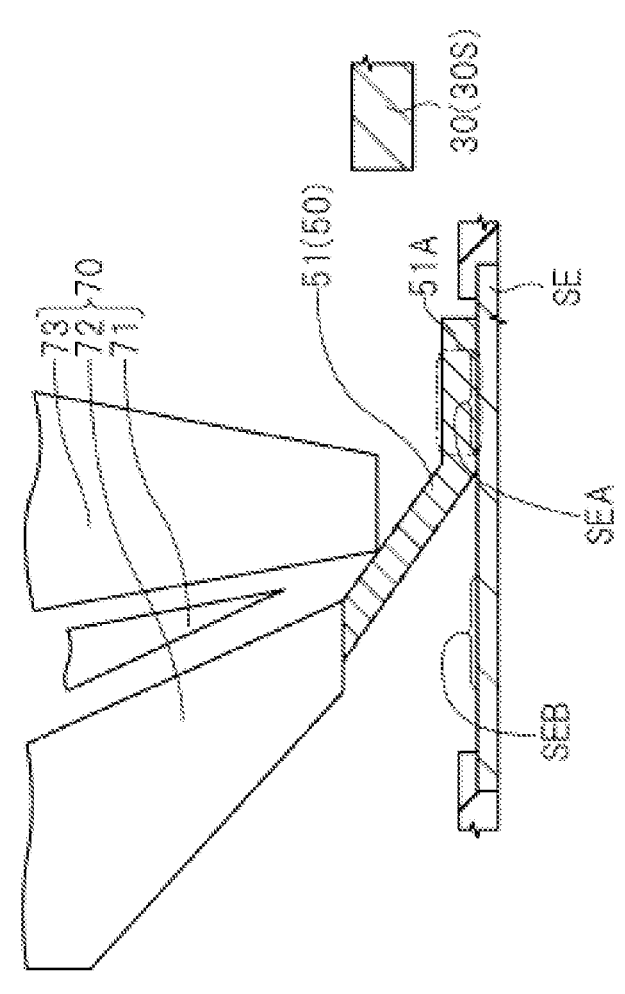
FIG. 16 is an enlarged cross-sectional view showing a state after the wedge bonder is moved from above the first-pad-bonding portion, following FIG. 15.
Figure 17:
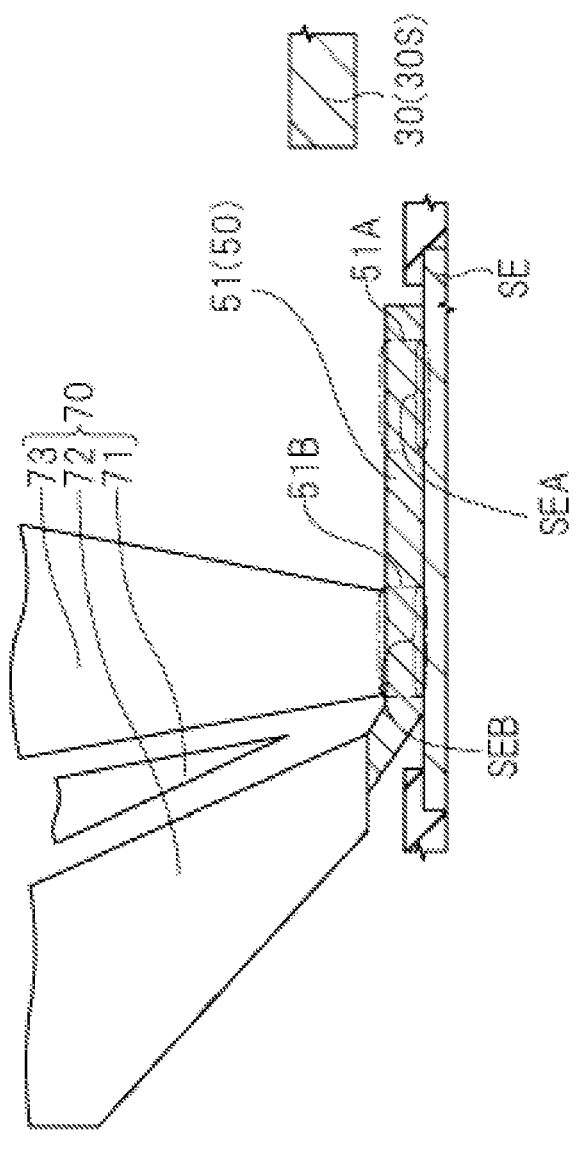
FIG. 17 is an enlarged cross-sectional view showing a state that the first ribbon is bonded to a second-pad-bonding portion of the source pad, following FIG. 16.

Bonding the ribbon 51 includes bonding a portion 51A of the ribbon 51 of the wire 12S to the pad-bonding portion SEA of the source pad SE, as shown in FIG. 15. Further, the step of bonding the ribbon 51 includes a step of bonding the portion 51A of the ribbon 51 as shown in FIG. 17, and then bonding the portion 51B of the ribbon 51 to the pad-bonding portion SEB of the source pad SE located farther away from the lead 30S than the pad-bonding portion SEA of the source pad SE. Further, the step of bonding the ribbon 51 includes a step of moving the bonder 70 from the pad-bonding portion SEA onto the pad-bonding portion SEB as shown in FIG. 16 after the step of bonding the portion 51A and prior to the step of bonding the portion 51B. In addition, the step of bonding the ribbon 51 includes a step of, after the portion 51B of the ribbon 51 is bonded to the source pad SE, cutting the partial 51C of the ribbon 51 by the cutter 71 and separating the ribbon 51 including the portion 51A and the portion 51B from the guide 72, as shown in FIG. 18.

In the step of bonding the portion 51A shown in FIG. 15, the wedge tool 73 is pressed with the portion 51A of the ribbon 51 sandwiched between the pad-bonding portion SEA and the distal end surface of the wedge tool 73. At this time, the portion 51A is bonded to the pad-bonding portion SEA by applying a load and ultrasonic waves to the ribbon 51 from the wedge tool. At this time, by applying ultrasonic waves from the wedge tool 73, the portion 51A of the ribbon 51 and the source pad SE are easily bonded to each other.

In the step of moving the bonder 70 shown in FIG. 16 from the pad-bonding portion SEA onto the pad-bonding portion SEB, the wedge tool 73 is moved onto the pad-bonding portion SEB after being pulled up above the portion 51A or while being pulled up above the portion 51A. In this case, from the viewpoint of stably junction the ribbon 52 (see FIG. 22) on the ribbon 51, the height of the loops formed between the portion 51A and the portion 51B shown in FIG. 18 is preferably as low as possible.

In the step of bonding the portion 51B shown in FIG. 17, the portion 51A is thermocompression bonded to the pad-bonding portion SEA in the same manner as the method of bonding the portion 51A described with reference to FIG. 15.

In the step of cutting the ribbon 51 shown in FIG. 18, the ribbon 51 is cut while the state of the wedge tool 73 is moved farther away from the portion 51A than the portion 51B of the ribbon 51. Here, it is preferable that the position of the portion 52B shown in FIG. 22, which will be described later, is disposed at a position farther away from the lead 30S than the portion 51B shown in FIG. 18. Accordingly, the distance D52 shown in FIG. 22 can be made longer than the distance D51 shown in FIG. 18. As will be described later, when a loop is formed between the portion 51A and the portion 51B, the junction can be stabilized by making the distance D52 shown in FIG. 22 longer than the distance D51 shown in FIG. 18.

However, as a modified example, after the portion 51B is joined as shown in FIG. 17, the ribbon 51 may be cut without moving the wedge tool 73. In this case, the range D51 can be increased as compared with the case shown in FIG. 18. For example, when only the ribbon 51 is a wire 12S as modified example for the present embodiment, the ribbon 51 is cut, and then the process proceeds to the lead bonding process shown in FIG. 11. In this case, applying a method of cutting without moving the wedge tool 73 after bonding the portion 51B is more effective from the viewpoint of reducing the ON-resistance.

As shown in the present embodiment, the bonder 70 is disposed such that the guide 72 of the bonder 70 is located farther away from the lead 30S than the wedge tool 73 of the bonder 70 when the bonding is performed first on the pad-bonding portion SEA that is relatively close to the lead 30S. In this case, even when the distance from the portion 51A of the ribbon 51 to be joined first to the lead 30S is short, the guide 72 and the lead 30S do not interfere with each other. Therefore, according to the present embodiment, it is possible to make the portion 51A of the ribbon 51 closer to the lead 30S. In other words, according to the present embodiment, the distance D3 shown in FIG. 9 can be shortened.

Figure 19:
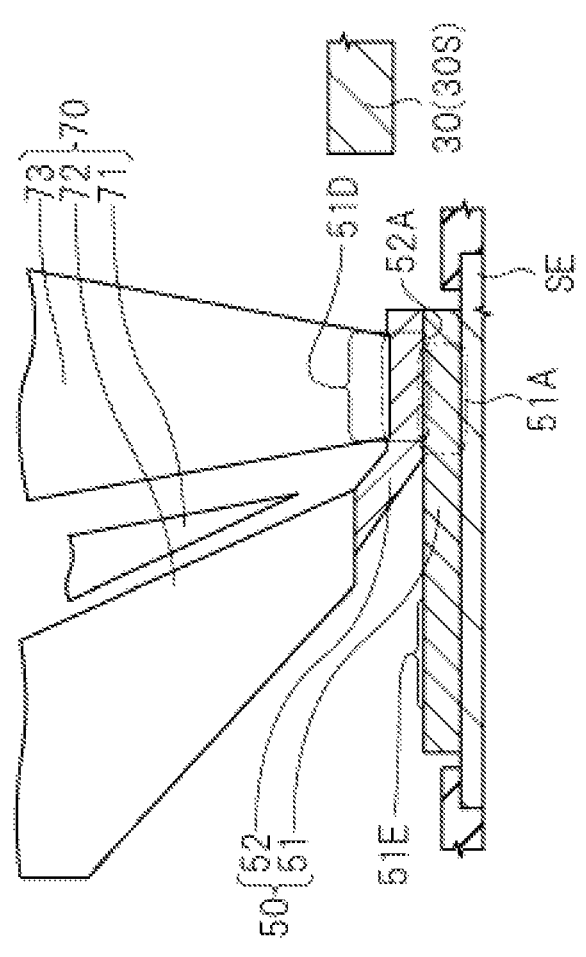
FIG. 19 is an enlarged cross-sectional view showing a state that a second ribbon is bonded to a first-ribbon-bonding portion of the first ribbon by using the wedge bonder.

In the present embodiment, after the ribbon 51 is cut, the ribbon 52 is bonded onto the ribbon 51 as shown in FIGS. 19 to 22. The step of bonding the ribbon 52 includes the following steps. First, as shown in FIG. 18, after the ribbon 51 is cut, as shown in FIG. 19, a portion 52A of the ribbon 52 of the wire 12S is bonded to the ribbon-bonding portion 51D of the ribbon 51. In addition, the step of bonding the ribbon 52 includes a step of bonding the portion 52B of the ribbon 52 to the ribbon-bonding portion 51E of the ribbon 51 located farther away from the lead 30S than the ribbon-bonding portion 51D of the ribbon 51 after bonding the portion 52A. Bonding the ribbon 52 also includes moving the bonder 70 from the ribbon-bonding portion 51D onto the ribbon-bonding portion 51E after bonding the portion 52A and prior to bonding the portion 52B. The step of bonding the ribbon 52 also includes, after joining the portion 52B, cutting the partial 52C of the ribbon 52 with a cutter to separate the ribbon 52 including the portion 52A and the portion 52B from the guide 72, as shown in FIG. 22.

In the step of bonding the portion 52A shown in FIG. 19, the portion 51A of the ribbon 52 is thermocompression bonded to the ribbon bonding portion SE of the ribbon 51 in the same manner as the step of bonding the partial SEA to the pad bonding portion described with reference to FIG. 15. At this time, when the ultrasonic wave is applied from the wedge tool 73, as shown in FIG. 19, the position of the portion 52A of the ribbon 52 is preferably arranged at a position closer to the lead 30S than the portion 51A of the ribbon 51. In other words, in the step of bonding the portion 52A, the ribbon-bonding portion 51D is preferable arranged at a position closer to the lead 30S than the portion 51A of the ribbon 51. When the bonding is performed by applying ultrasonic waves, it is preferable to avoid the ribbon 52 being bonded to the looped portion between the portion 51A and the portion 51B shown in FIG. 18. By joining the ribbon 52 to a portion of the ribbon 51 other than the looped portion between the portion 51A and the portion 51B, the ultrasonic bonding can be stabilized.

Figure 20:
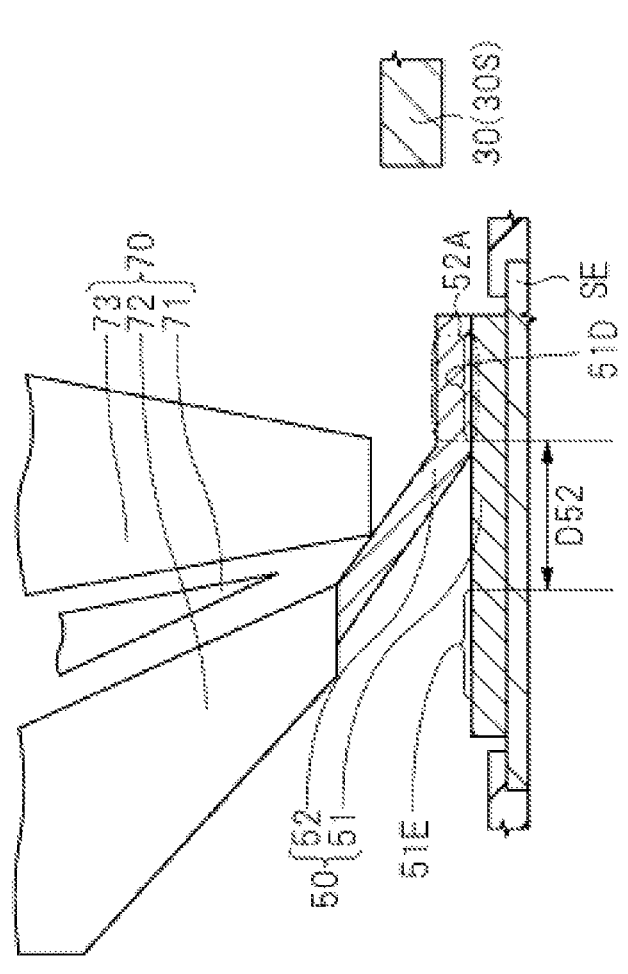
FIG. 20 is an enlarged cross-sectional view showing a state after the wedge bonder is moved from above the first-ribbon-bonding portion, following FIG. 19.

The step of moving the bonder 70 shown in FIG. 20 from the ribbon-bonding portion 51D onto the ribbon-bonding portion 51E is the same as the step described with reference to FIG. 16, and therefore, redundant explanation will be omitted. It is preferable to lower the loop height of the loop portion formed between the portion 52A and the portion 52B shown in FIG. 22, and the countermeasure is also as described above.

Figure 21:
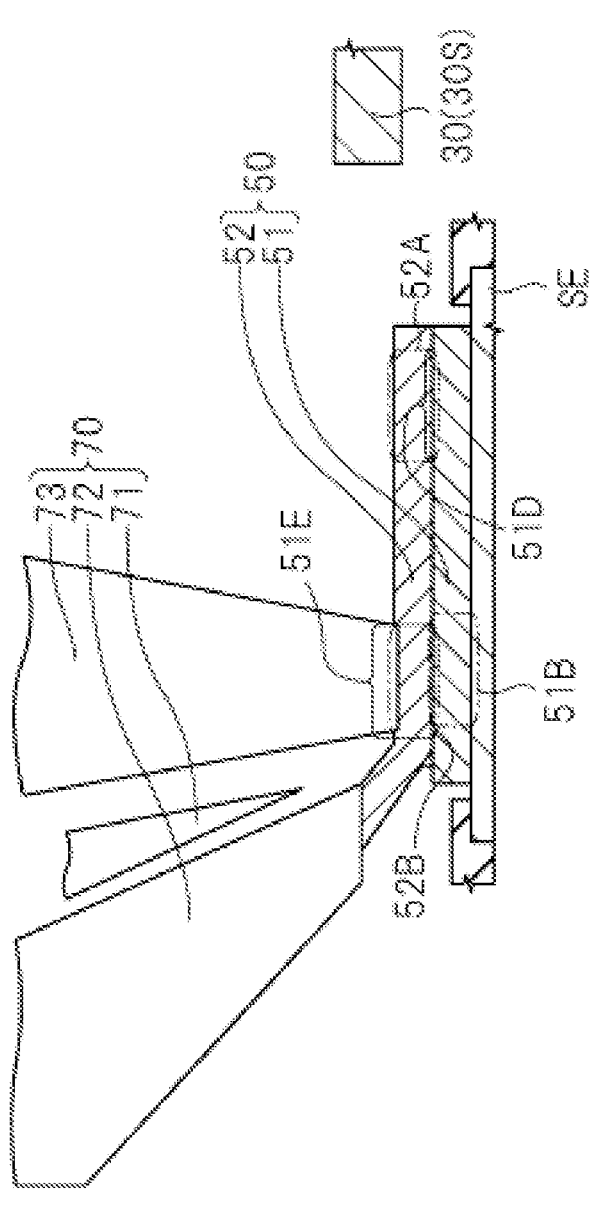
FIG. 21 is an enlarged cross-sectional view showing a state that the second ribbon is bonded to a second-ribbon-bonding portion of the first ribbon, following FIG. 20.

In the step of bonding the portion 52B shown in FIG. 21, the portion 51A is thermocompression bonded to the pad-bonding portion SEA in the same manner as the method of bonding the portion 51A described with reference to FIG. 15. At this time, when the ultrasonic wave is applied from the wedge tool 73, as shown in FIG. 21, the position of the portion 52B of the ribbon 52 is preferable located at a position farther away from the lead 30S than the portion 51B of the ribbon 51. In other words, in the step of bonding the portion 52B, the ribbon-bonding portion 51E is preferably disposed at a position farther away from the lead 30S than the portion 51B of the ribbon 51. As described above, by avoiding the ribbon 52 being bonded to the looped portion between the portion 51A and the portion 51B shown in FIG. 18, the ultrasonic bonding is stabilized.

In the step of cutting the ribbon 52 shown in FIG. 22, the ribbon 52 is cut while the state of the wedge tool 73 is moved farther away from the portion 52A than the portion 52B of the ribbon 52. Here, the position of the portion 53B shown in FIG. 26, which will be described later, is preferable in that it is easily located at a position farther away from the lead 30S than the portion 52B shown in FIG. 22. Accordingly, the distance D53 shown in FIG. 26 can be made longer than the distance D52 shown in FIG. 22.

However, as a modified example, after the portion 51B is joined as shown in FIG. 21, the ribbon 52 may be cut without moving the wedge tool 73. In this case, the range D52 can be increased as compared with the case shown in FIG. 22. For example, when only the ribbon 51 and the ribbon 52 are wire 12S as modified example to the present embodiment, the ribbon 52 is cut, and then the process proceeds to the lead bonding process shown in FIG. 11. In this case, applying a method of cutting without moving the wedge tool 73 after bonding the portion 52B is more effective from the viewpoint of reducing the ON-resistance.

Figure 23:
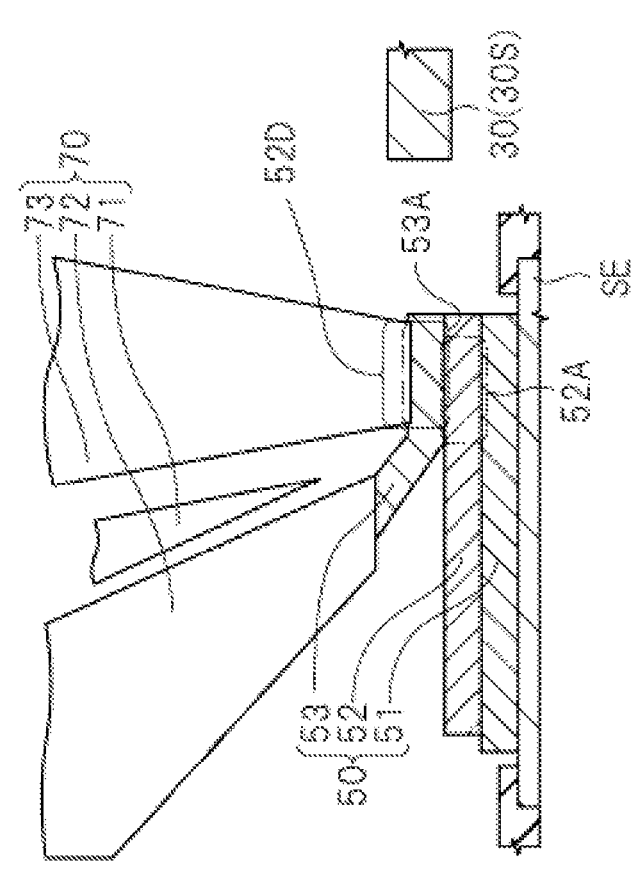
FIG. 23 is an enlarged cross-sectional view showing a state that a third ribbon is bonded to a third-ribbon-bonding portion of the second ribbon by using the wedge bonder.

In the present embodiment, after the ribbon 52 is cut, the ribbon 53 is bonded onto the ribbon 52 as shown in FIGS. 23 to 26. The step of bonding the ribbons 53 includes the following steps. First, as shown in FIG. 22, after the ribbon 52 is cut, as shown in FIG. 23, a portion 53A of the ribbon 53 of the wire 12S is bonded to the ribbon-bonding portion 52D of the ribbon 52. In addition, the step of bonding the ribbon 53 includes a step of bonding the portion 53B of the ribbon 53 to the ribbon-bonding portion 52E of the ribbon 52 located farther away from the lead 30S than the ribbon-bonding portion 52D of the ribbon 52 after joining the portion 53A. The step of bonding the ribbon 53 includes moving the bonder 70 from the ribbon-bonding portion 52D onto the ribbon-bonding portion 52E after the step of bonding the portion 53A and prior to the step of bonding the portion 53B. The step of bonding the ribbon 53 also includes, after bonding the portion 53B, cutting the partial 53C of the ribbon 53 by a cutter and separating the ribbon 53 including the portion 53A and the portion 53B from the guide 72, as shown in FIG. 26.

In the step of bonding the portion 53A shown in FIG. 23, the portion 53A of ribbon 53 is thermocompression bonded to the ribbon-bonding portion 52D of ribbon 52 in a manner similar to the step of bonding the portion 52A described with reference to FIG. 15 to the pad-bonding portion SEA of the source pad SE. At this time, when the ultrasonic wave is applied from the wedge tool 73, as shown in FIG. 23, the position of the portion 53A of the ribbon 53 is preferable arranged at a position closer to the lead 30S than the portion 52A of the ribbon 52. In other words, in the step of bonding the portion 53A, the ribbon-bonding portion 52D is preferably arranged at a position closer to the lead 30S than the portion 52A of the ribbon 52. When the bonding is performed by applying ultrasonic waves, it is preferable to avoid the ribbon 53 being bonded to the looped portion between the portion 52A and the portion 52B shown in FIG. 18. By joining the ribbon 53 to a portion of the ribbon 52 other than the looped portion between the portion 52A and the portion 52B, the ultrasonic bonding can be stabilized.

Figure 24:
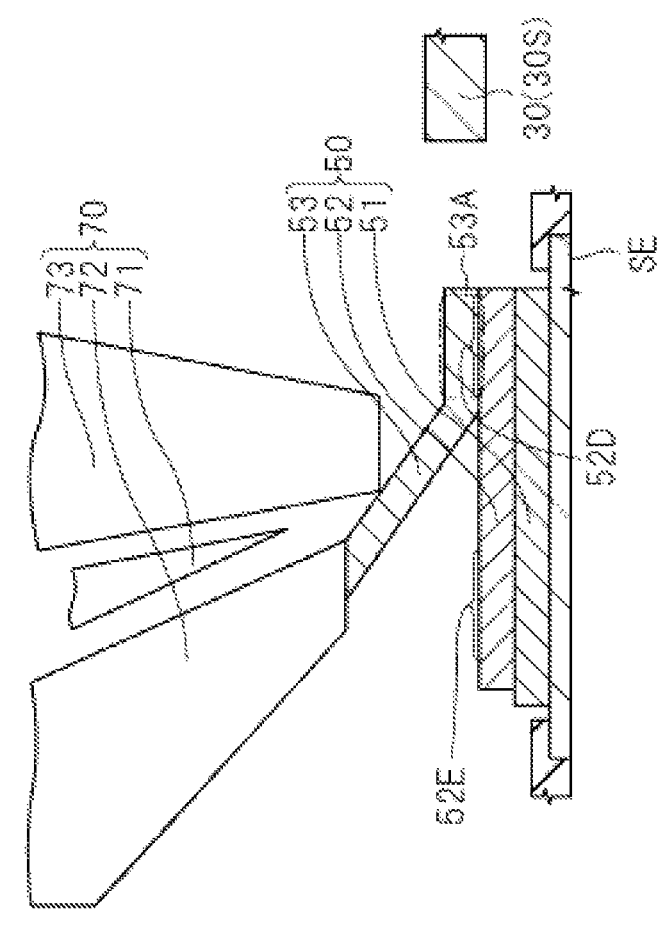
FIG. 24 is an enlarged cross-sectional view showing a state after the wedge bonder is moved from above the third-ribbon-bonding portion, following FIG. 23.

The step of moving the bonder 70 shown in FIG. 24 from the ribbon ribbon-bonding portion 52D onto the ribbon-bonding portion 52E is the same as the step described with reference to FIG. 16, and therefore, redundant explanation will be omitted. It is preferable to lower the loop height of the loop portion formed between the portion 53A and the portion 53B shown in FIG. 26, and the countermeasure thereof is also as described above.

Figure 25:
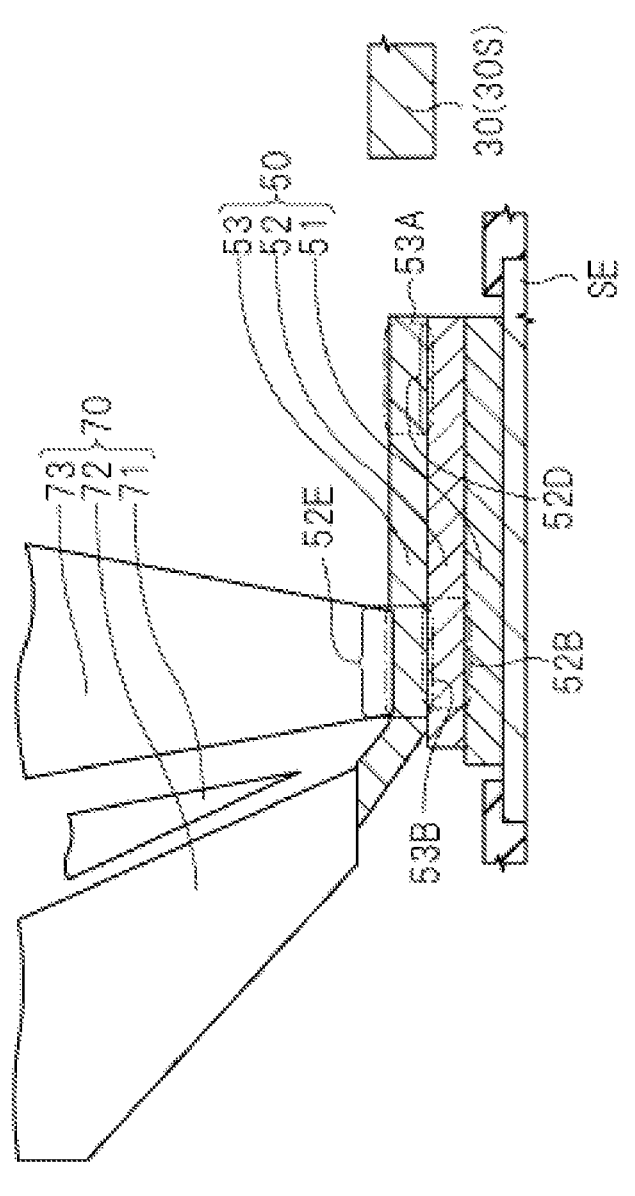
FIG. 25 is an enlarged cross-sectional view showing a state that the third ribbon is bonded to a fourth-ribbon-bonding portion of the second ribbon, following FIG. 24.

In the step of bonding the portion 53B shown in FIG. 25, the portion 52A is thermocompression bonded to the pad-bonding portion SEA in the same manner as the method of bonding the portion 52A described with reference to FIG. 15. At this time, when the ultrasonic wave is applied from the wedge tool 73, as shown in FIG. 25, the position of the portion 53B of the ribbon 53 is preferable located at a position farther away from the lead 30S than the portion 52B of the ribbon 52. In other words, in step of bonding the portion 53B, the ribbon-bonding portion 52E is preferably disposed at a position farther away from the lead 30S than the portion 52B of the ribbon 52. In the same manner as described above, this is to prevent the ribbon 53 from being joined to the looped portion between the portion 52A and the portion 52B shown in FIG. 22, thereby stabilizing the ultrasonic bonding.

In the step of cutting the ribbon 53 shown in FIG. 26, after the portion 52B is bonded as shown in FIG. 25, the ribbon 53 is cut without moving the wedge tool 73. In this case, the distance D53 shown in FIG. 26 can be increased. In the present embodiment case, the distance (separation distance) D53 between the part 53A and the part 53B shown in FIG. 26 is longer than the distance (separation distance) D52 between the part 52A and the part 52B shown in FIG. 22. Further, the distance (separation distance) D52 between the portion 52A and the portion 52B shown in FIG. 22 is longer than the distance (separation distance) D51 between the portion 51A and the portion 51B shown in FIG. 18. This makes it easier to avoid that the junction portion of the ribbon disposed in the upper layer overlaps the loop portion of the ribbon in the lower layer.

However, as a modified example, as shown in FIG. 25, after the portion 52B is bonded, the ribbon 53 may be cut while the state of the wedge tool 73 is moved farther away from the portion 53A than the portion 53B of the ribbon 53 in the same manner as the embodiment described with reference to FIG. 18 and FIG. 22. For example, when a ribbon (not shown) as a wire 12S is further stacked on the ribbon 53, this modified example is useful from the viewpoint of avoiding bonding to the looped portion.

<Bonding Step of Lead>

Figure 27:
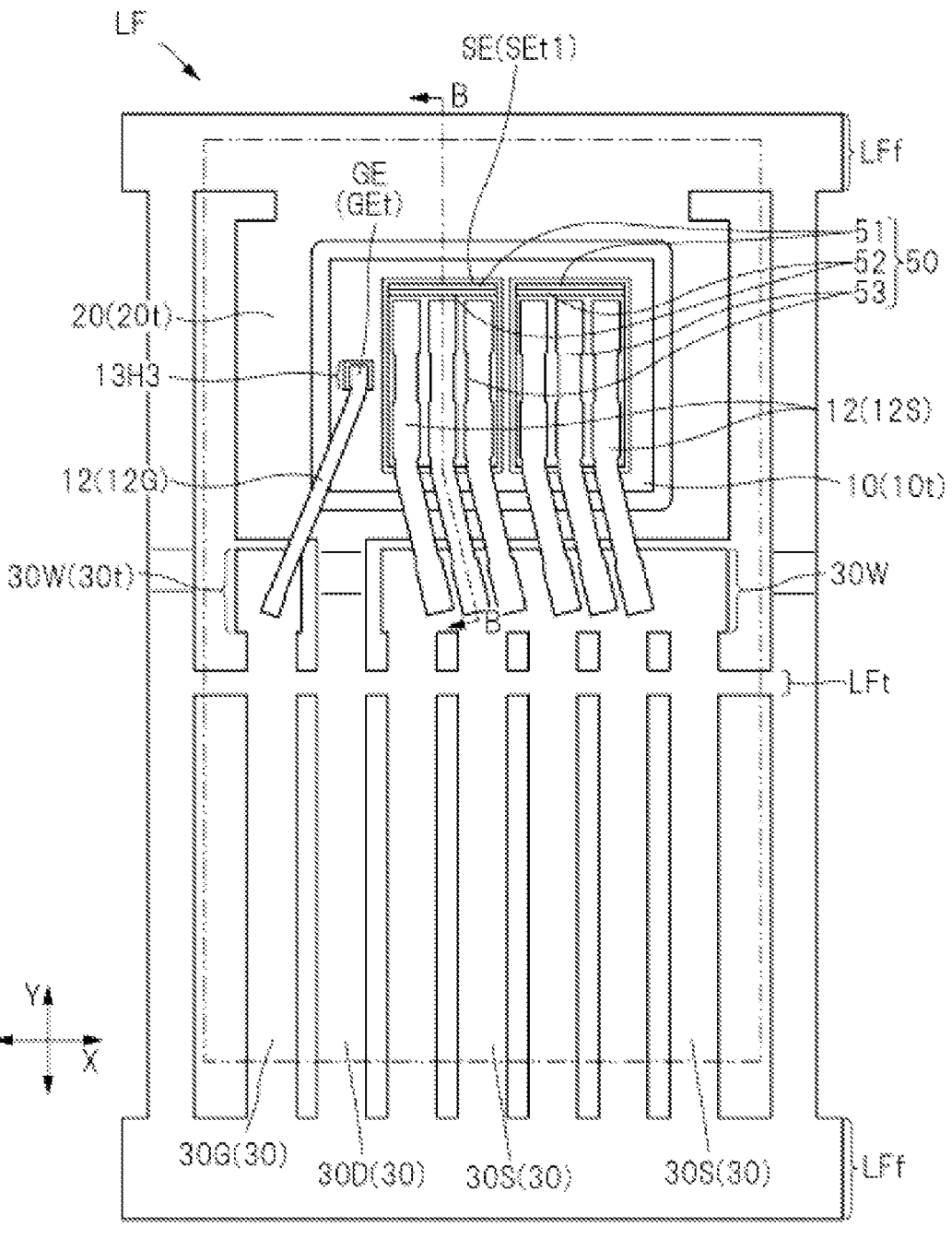
FIG. 27 is an enlarged plan view showing a state that the semiconductor chip shown in FIG. 14 is electrically connected with a lead shown in FIG. 14 via a wire.

Next, in the bonding step of the lead shown in FIG. 11, as shown in FIG. 27, the source pad SE of the semiconductor chip 10 and the plurality of lead 30S are electrically connected via the wire 12S and the wire (conductive member) 12S. In this step, the gate pad GE of the semiconductor chip and the lead 30G are electrically connected to each other via a wire (conductive member) 12G. FIG. 27 is an enlarged plan view showing a state that the semiconductor chip shown in FIG. 14 is electrically connected with a lead shown in FIG. 14 via a wire.

As shown in FIG. 27, in this step, the gate pad GE of the semiconductor chip 10 and the lead 30G are electrically connected to each other via the wire 12S and the wire 12G. In this step, the source pad SE of the semiconductor chip 10 and the lead 30S are electrically connected to each other via the wire 12S and the wire 12S. The transmission path including the gate pad GE has a smaller effect on the performance of semiconductor device (in particular, the performance from the viewpoint of reducing the ON-resistance) as compared with the transmission path including the source pad SE. Therefore, the gate pad GE is not bonded with the wire 12S on the gate pad 12G, and is directly bonded to the gate pad.

On the other hand, in the transmission path including the source pad SE, as described above, the wire 12S is bonded to the wire 12S from the viewpoint of reducing the ON-resistance. Specifically, the connecting portion SE of the wire 12S is joined to the wire 12S connecting portion 12B1 and the connecting portion 12B2 bonded to the wire 12B3 bonded to the source pad 12S, and the connecting portion 30S is joined to the lead-bonding portion 30W of the lead bonding portion upper surface (bonding surface) 30t. In addition, the connection portion SEt2 of the wire SE is joined to the connection portion 12S (refer to FIG. 7) and the connecting portion 12B1 of the wire (refer to FIG. 7), which are other portions of the source pad 12S, and the connecting portion 12B2 is joined to the lead-bonding portion 30W of the lead 30S on upper surface (connection surface) 30t. Hereinafter, a process of electrically connecting the source pad SE and the lead 30S for the source in the lead bonding process will be described with reference to FIGS. 27 to 31.

FIG. 28 to FIG. 31 are an enlarged cross-sectional view showing, for each step, a state that a conductive member (a wire in the present embodiment) is bonded to a conductive member on a pad by using a wedge bonder, in the bonding step of the lead shown in FIG. 11. In this step, the bonding step of the lead is performed by using a bonder (wedge bonder) 80 shown in FIGS. 28 to 31. For the present embodiment, six wire 12S are bonded to the wire 12S as shown in FIG. 27. In the following, one of the six wire 12S will be described as a typical example.

The bonder 80 includes a cutter 81 capable of cutting a wire 12S which is a conductive member, a guide 82 capable of supplying a wire 12S, and a wedge tool 83 located adjacent to the guide 82 and capable of pressing a wire 12S. In the examples shown in FIGS. 28 to 31, the bonder 80 and the bonder are different in structure from the bonder 70 described with reference to FIGS. 15 to 26 in the following points. The wedge tool 83 is located between the cutter 81 and the guide 82. Further, the area of the distal end surface (the surface pressing the wire) of the wedge tool 83 of the bonder 80 is smaller than the area of the distal end surface (the surface pressing the ribbon 51) of the wedge tool 73 of the bonder 70 shown in FIG. 15. Therefore, the bonder 80 as a whole is smaller than the bonder 70. However, as modified example, the lead bonding process can be performed by using the bonder 70 described with reference to FIGS. 15 to 26.

The guide 82 is a tool capable of continuously supplying a metallic wire, which is a raw material of the wire 12S. The wire 12S shown in FIG. 28 is sequentially unwound from the distal end of the guide 82 and is disposed on upper surface of the conductive member 50 (upper surface of the ribbon 53 for the present embodiment) in response to the movement of the guide 82.

The wedge tool 83 is a tool for thermocompression bonding the junction object and the bonded object by pressing the leading end of the wedge tool against the junction object (a wire 12S in the case of the present embodiment), and by transferring thermally and ultrasonic waves to the junction object and the bonded object (the conductive member 50 in the case of the present embodiment).

In the bonding step of the lead according to the present embodiment, since the conductive member 50 is bonded to the source pad SE, the height difference between upper surface of the conductive member 50 and upper surface of the lead 30S is small. Therefore, even when the bonder 80 or the bonder 70 is used, it is difficult for the lead 30S to interfere with the guides of the bonder. Therefore, in the lead bonding process of the present embodiment, the forward bonding method can be applied, or the reverse bonding method can be applied. Hereinafter, a case where the forward bonding method is typically applied will be described, and a case where the reverse bonding method is applied as modified example will be described.

Figure 28:
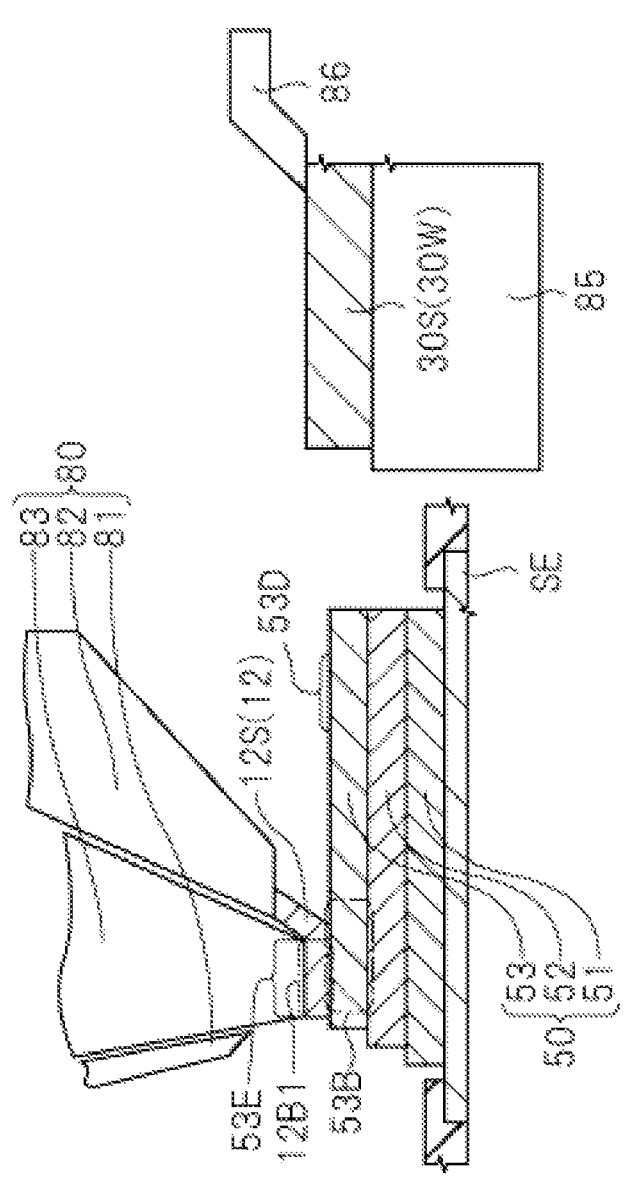
FIG. 28 is an enlarged cross-sectional view showing a state that the wire is bonded to a fifth-ribbon-bonding portion of the third ribbon by using a wedge bonder, in a ribbon bonding step shown in FIG. 11.
Figure 29:
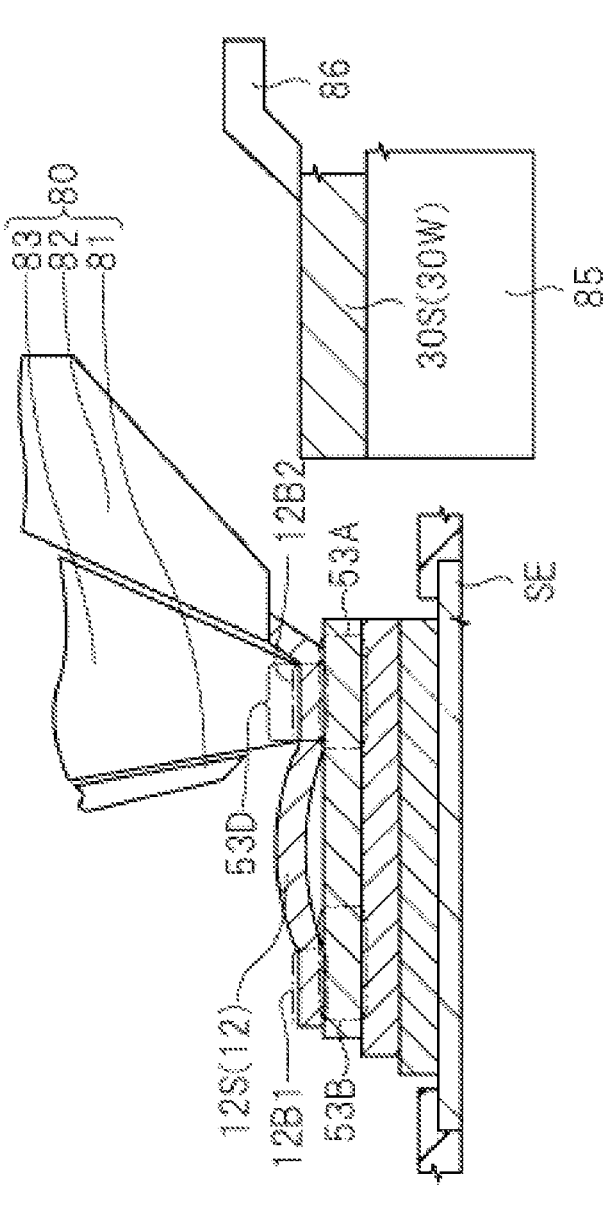
FIG. 29 is an enlarged cross-sectional view showing a state that the wire is bonded to a sixth-ribbon-bonding portion of the third ribbon, following FIG. 28.
Figure 30:
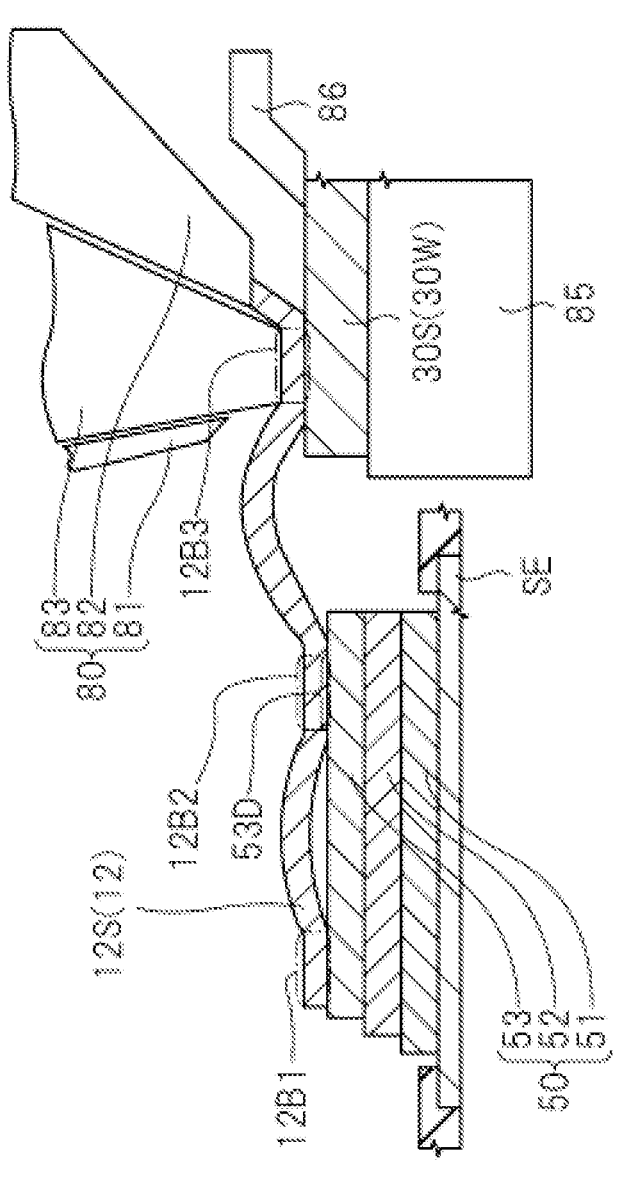
FIG. 30 is an enlarged cross-sectional view showing a state that the wire is bonded to a lead connecting portion of a source lead, following FIG. 29.
Figure 31:
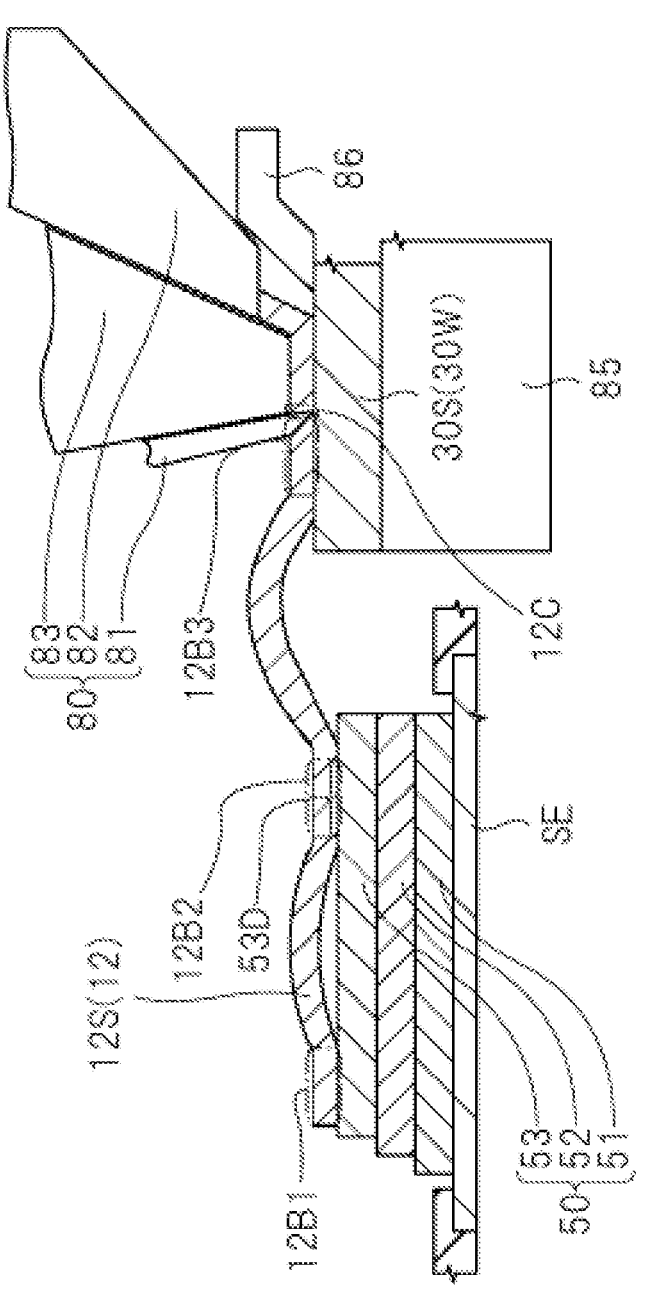
FIG. 31 is an enlarged cross-sectional view showing a state that the wire is cut, following FIG. 30.

The bonding step of the lead includes a step of bonding the connecting portion 12B1 of the wire 12S to the ribbon-bonding portion 53E of the ribbon 53, as shown in FIG. 28. In addition, the bonding step of the lead includes a step of bonding the connecting portion 12B2 of the wire 12S to the ribbon-bonding portion 53D of the ribbon 53 located closer to the lead 30S than the ribbon-bonding portion 53E of the ribbon 53 after bonding the connecting portion 12B1 of the wire 12S as shown in FIG. 29. Further, although not shown, the bonding step of the lead includes a step of moving the bonder 80 from the ribbon-bonding portion 53E onto the ribbon-bonding portion 53D after the step of bonding the connecting portion 12B1 and prior to the step of bonding the connecting portion 12B2. Further, the bonding step of the lead includes a step of bonding the connecting portion 12B3 of the wire 12S to the lead-bonding portion 30W of the lead 30S after bonding the connecting portion 12B2 of the wire 12S as shown in FIG. 30. Further, although not shown, the bonding step of the lead includes a step of moving the bonder 80 from the ribbon-bonding portion 53D onto the lead-bonding portion 30W after the step of bonding the connecting portion 12B2 and prior to the step of bonding the connecting portion 12B3. Further, the bonding step of the lead includes a step of, after bonding the connecting portion 12B3 of the wire 12S to the lead-bonding portion 30W, cutting the portion 12C of the wire 12S by the cutter 81 and separating the wire 12S including the connecting portion 12B1, the connecting portion 12B2, and the connecting portion 12B3 from the guide 82, as shown in FIG. 31.

In the step of bonding the connecting portion 12B1 shown in FIG. 28, the wedge tool 83 is pressed with the connecting portion 12B1 of the wire 12S sandwiched between the ribbon-bonding portion 53E of the ribbon 53 and the distal end surface of the wedge tool 83. At this time, the connecting portion 12B1 is thermocompression bonded to the ribbon-bonded portion 53E by applying pressure and heat to the wire 12S from the wedge tool. Further, at this time, by applying the ultrasonic wave from the wedge tool 83, the connecting portion 12B1 of the wire 12S and the source pad SE are easily bonded to each other.

When an ultrasonic wave is applied from the wedge tool 83, as shown in FIG. 28, the position of the connecting portion 12B1 of the wire 12S is preferably located farther away from the lead 30S than the portion 53B of the ribbon 53. In other words, in the step of bonding the connecting portion 12B1 of the wire 12S, the ribbon-bonded portion 53E is preferably disposed at a position farther away from the lead 30S than the portion 52B of the ribbon 52. When the bonding is performed by applying ultrasonic waves, it is preferable to avoid the wire 12S being bonded to the looped portion between the portion 53A and the portion 53B shown in FIG. 26. By joining the ribbon 53 to a portion other than the looped portion between the portion 53A and the portion 53B of the ribbon 53, it is possible to stabilize the joining by ultrasonic waves.

However, when the area of the distal end surface of the wedge tool 83 is smaller than the area of the distal end surface of the wedge tool 73 shown in FIG. 26, as in the present embodiment, bonding to the looped portion can be avoided even if the center of the portion 53B of the ribbon 53 overlaps with the center of the connecting portion 12B1 of the wire 12S.

Next, in the step of moving the bonder 80 from the ribbon-bonded portion 53E onto the ribbon-bonding portion 53D, the wedge tool 83 is moved onto the ribbon-bonding portion 53D after being pulled up above the connecting portion 12B1 or while being pulled up above the connecting portion 12B1. In the wire 12S, the conductive member is not further laminated on the wire 12S. Therefore, in the bonding step of the lead, the height of the loops formed between the connecting portion 12B1 and the connecting portion 12B2 shown in FIG. 31 is not particularly limited. In the present embodiment case, the height of the loop formed between the connecting portion 12B1 and the connecting portion 12B2 shown in FIG. 31 is higher than the loop height between the part 51A and the part 51B shown in FIG. 18.

Next, in the step of bonding the connecting portion 12B2 shown in FIG. 29, the connecting portion 12B1 is thermo-compression bonded to the ribbon-bonded portion 53D in the same manner as the method of bonding the connecting portion 12B1 described with reference to FIG. 28.

When an ultrasonic wave is applied from the wedge tool 83, the position of the connecting portion 12B2 of the wire 12S is preferably arranged closer to the lead 30S than the portion 53A of the ribbon 53. In other words, in the step of bonding the connecting portion 12B2 of the wire 12S, the ribbon-bonding portion 53D is preferably arranged at a position closer to the lead 30S than the portion 52A of the ribbon 52. As a result, the ribbon 53 can be bonded to a portion of the ribbon 53 other than the looped portion between the portion 53A and the portion 53B, and thus the junction by ultrasonic waves can be stabilized. However, as shown in FIG. 29, when the loop portion between the portion 53A and the portion 53B of the ribbon 53 does not overlap with the connecting portion 12B2 of the wire 12, the ultrasonic bonding can be stabilized even if the loop portion is not disposed closer to the lead 30S than the portion 52A of the ribbon 52.

In the step of bonding the connecting portion 12B2 of the wire 12S of the present embodiment, since the difference in height between upper surface of the ribbon 53 and 30S of the lead upper surface is small, the guide 82 and the lead 30S can be prevented from interfering with each other as shown in FIG. 29 even if the distance between the lead 30S and the connecting portion 12B2 of the wire 12S is short. In other words, according to the present embodiment, the connecting portion 12B2 of the wire 12S can be joined to the vicinity of the lead 30S. As a result, the ON-resistance can be reduced.

Next, in the step of moving the bonder 80 from the ribbon-bonding portion 53D onto the lead joint 30W, the wedge tool 83 is moved onto the ribbon-bonding portion 53D after being pulled up above the connecting portion 12B2 or while being pulled up above the connecting portion 12B2.

The step of bonding the connecting portion 12S of the wire 12B3 shown in FIG. 30 to the lead-bonding portion 30W and the step of cutting the wire 12S shown in FIG. 31 are performed with at least the lower surface of the wire 30S fixed by the stage 85 shown in FIG. 30 and upper surface of the wire 30W of the clamper 86 fixed. The position of the clamper 86 is preferably located as close to the leading end surface of the lead 30S (the surface facing the conductive member 50) as possible, so long as it can avoid interfering with the guide 82. In the present embodiment, the entire lead bonding process (that is, from the process of bonding the connecting portion 12B1 shown in FIG. 28) is performed with the lead frame LF (see FIG. 27) disposed on the stage 85 and with a part of the lead 30S suppressed by the clamper 86.

In the step of bonding the connecting portion 12B3 of the wire 12S to the lead-bonding portion 30W, the connecting portion 12B1 is thermocompression bonded to the lead-bonding portion 30W in the same manner as the method of bonding the connecting portion 12B1 described with reference to FIG. 28. Even in this step, the ultrasonic wave may be applied from the wedge tool 83 to the connecting portion 12B3 of the wire 12S. In this step, the bonding strength can be stabilized by performing the state with the lead 30S sandwiched between the stage 85 and the clamper 86.

In the step of cutting the wire 12S shown in FIG. 31, the wire 12S is cut while the state of the wedge tool 83 is moved farther away from the connecting portion 12B3 than the connecting portion 12B1 of the wire 12S. When the bonder 80 is used, it is necessary to move the bonder 80 as shown in FIG. 31. On the other hand, when a bonder having a configuration similar to that of the bonder 70 shown in FIG. 18 is used, after the connecting portion 12B3 shown in FIG. is joined to the lead-bonding portion 30W, the bonder can be cut without being moved.

Although the step of bonding the wire 12S to the conductive member 50 has been described with reference to FIGS. 28 to 31, in the present embodiment, the wire 12G shown in FIG. 28 is connected by using the bonder 80 shown in FIG. 28. In the wedge bonding method using the wire 12G, the steps shown in FIG. 28 can be omitted, but the same as the wedge bonding method described with reference to FIG. 28 to FIG. 31, such that redundant explanation will be omitted. However, the wire 12G only needs to be bonded to the gate pad GE at one position, and therefore, a ball bonding method may be used instead of the wedge bonding method. In the ball bonding process, the leading end of the wire is thermally melted to form a ball portion, and the ball portion is thermocompression bonded to the gate pad GE.

When the lead bonding process is performed by the forward bonding method as shown in the present embodiment, the wire 12S is cut on the lead 30S as shown in FIG. 31. On the other hand, as will be described later as modified example, when the wire 12S is bonded by the reverse-bonding method, the wire 12S is cut on the conductive member 50. Depending on the strength of the wire 12S, a scratch may remain in the junction portion due to a load applied when the wire 12S is cut. In particular, when a wire made of copper or a copper alloy which is harder than the ribbon 51, the ribbon 52, and the aluminum which is the material of the ribbon 53 is used as the wire 12S, a strong load is required at the time of cutting. In the case of the present embodiment, the lead 30S made of copper or a copper alloy is cut on the wire 12S, such that the damaged part to be joined (the lead 30S in the case of the present embodiment) can be suppressed even if a wire 12S made of copper or a copper alloy is used. Further, since the wire 12S is not cut on the conductive member 50, the conductive member 50 can be prevented from being damaged.

<Sealing Step>

Figure 32:
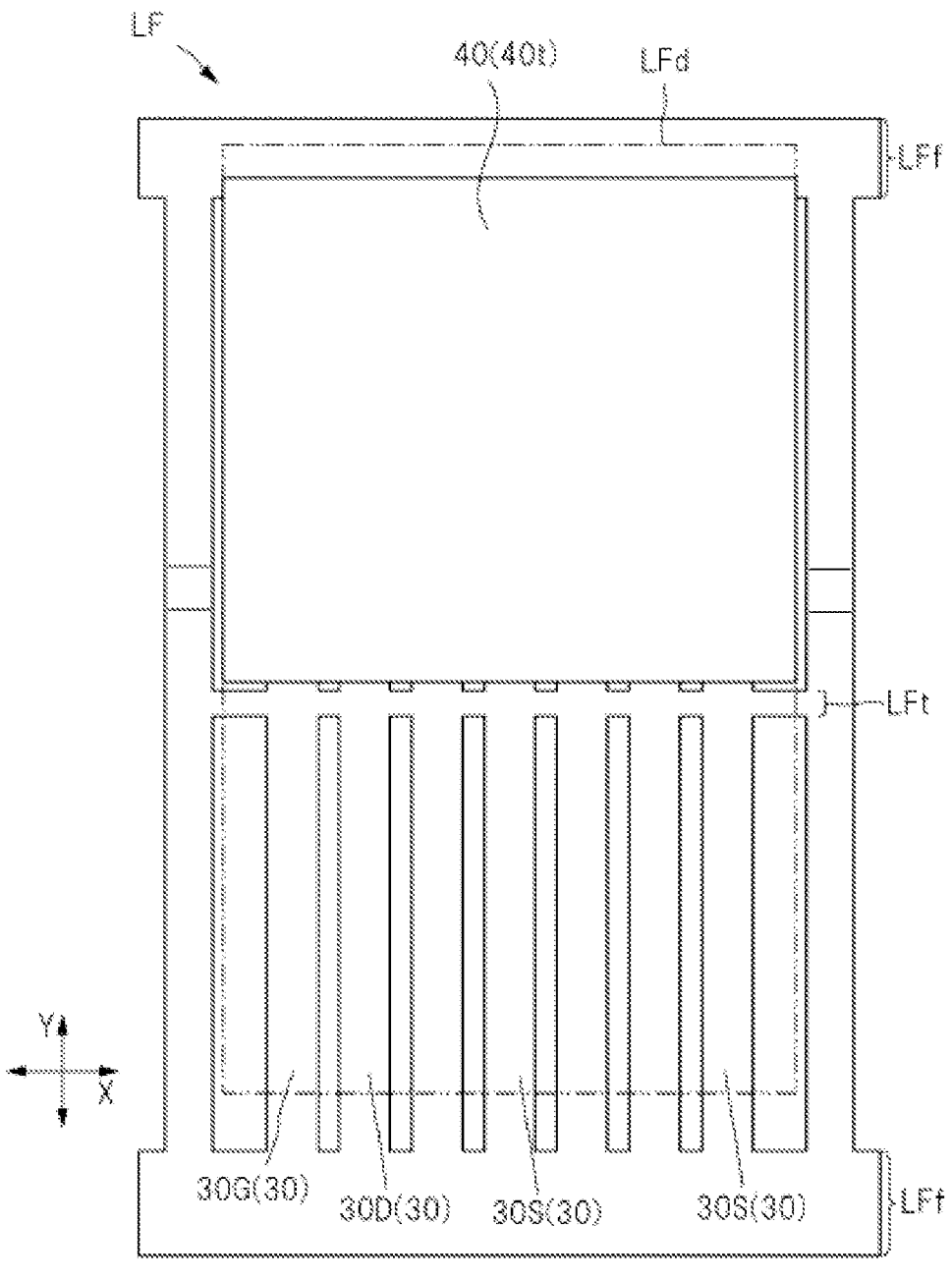
FIG. 32 is an enlarged plan view showing a state that a sealing body sealing the semiconductor chip and the wire shown in FIG. 27 is formed.

Next, in the sealing step shown in FIG. 11, the semiconductor chip 10, a portion of the die pad 20, the conductive member 30, a portion of each of the plurality of leads 30, and the plurality of wires 12 shown in FIG. 27 are sealed with an insulating resin, thereby forming the sealing body 40 shown in FIG. 32. FIG. 32 is an enlarged plan view showing a state that a sealing body sealing the semiconductor chip and the wire shown in FIG. 27 is formed.

In this step, for example, the sealing body 40 is formed by a so-called transfer molding method while the lead frame LF is disposed in a mold (not shown). In this step, as shown in FIGS. 4 and 6, the semiconductor chip 10 (refer to FIG. 6), the conductive member 50 (see FIG. 6), and the wire 12 (see FIG. 6) are resin-sealed such that the lower surface 20b of the die pad 20 is exposed.

Note that, although not shown, the lower surface 20b of the die pad 20 may not be exposed from the encapsulant 40 as a modified example to the present embodiment. In addition, as another modified example, only a portion of the die pad 20 may be exposed from the sealing body 40, and other portions may be sealed to the sealing body 40.

As shown in FIG. 32, in the lead frame LF, since the tie bar LFt connecting the plurality of leads 30 is cut in a singulation step described later, the sealing body 40 is formed such that the tie bar LFt is exposed.

After the sealing body 40 is molded, a portion of the thermosetting resin contained in the sealing body 40 is heated until it is cured (referred to as temporary curing). When the lead frame LF can be removed from the mold by the temporary curing, the lead frame LF is removed from the mold. Then, it is conveyed to a heater to further perform heat treatment (curing bake). As a result, the remaining portion of the thermosetting resin is cured, and the sealing body 40 shown in FIG. 32 is obtained.

Further, the sealing body 40 is mainly composed of an insulating resin, for example, by mixing filler particles such as silica (silicon dioxide; SiO2) particles to the thermosetting resin, it is possible to improve the function of the sealing body 40 (for example, resistance to warpage modification).

<Plating Step>

Next, in the plating step shown in FIG. 11, the lead frame LF is immersed in a plating solution (not shown), and a metal film (the metal film 22 and the metal film 32 shown in FIG. 6) is formed on the metal part (outer part) exposed from the sealing surface 40.

In this step, the metal films 22 and 32 (FIG. 6) made of, for example, solder are formed on the surface of the metal member exposed from the resin by the electrolytic plating method. Although not shown, in the electroplating method, a lead frame LF (see FIG. 32) which is a workpiece to be plated is disposed in a plating tank containing a plating solution. At this time, the workpiece is connected to the cathode in the plating bath. For example, the frame portion LFf (refer to FIG. 32) of the lead frame LF is electrically connected to the cathode. The metal films 22 and 32 are formed on the exposed surface of the metal member connected to the frame portion LFf of the lead frame LF by applying, for example, a DC voltage between the cathode and the anode disposed in the plating bath. In the present embodiment, the metallic films 22 and 32 are formed by a so-called electroplating method.

As described above, the metallic films 22 and 32 of the present embodiment are made of so-called lead-free solder substantially free of lead (Pb), such as tin (Sn) only, tin-bismuth (Sn—Bi), or tin-copper-silver (Sn—Cu—Ag). For this reason, the plating solution used in the present plating step is an electrolytic plating solution containing a metallic salt such as Sn2+ or Bi3+. Incidentally, in the following explanation, the alloying metal plating of Sn—Bi as an example of the lead-free solder plating, the bismuth (Bi) is replaced with a metal such as copper (Cu) or silver (Ag), or it can be replaced with an electrolytic plating solution in which not only bismuth (Bi) but copper (Cu) or silver (Ag) is added.

In the present embodiment, a plating process is performed while the die pad 20 (see FIG. 28) shown in FIG. 32 is electrically connected to the frame portion LFf via the lead 30. When a voltage is applied between the anode and the cathode while the lead frame LF is immersed in the plating solution, a current is supplied between the lead 30 and the die pad 20 connected to the cathode and the anode through the plating solution. At this time, Sn2+ and Bi3+ in the plating solution are deposited on the exposed surface of the lead 30 and the die pad 20 from the encapsulant 40 at a predetermined ratio, such that the metallic films 22 and 32 shown in FIG. 6 are formed.

<Singulation Step>

Figure 33:
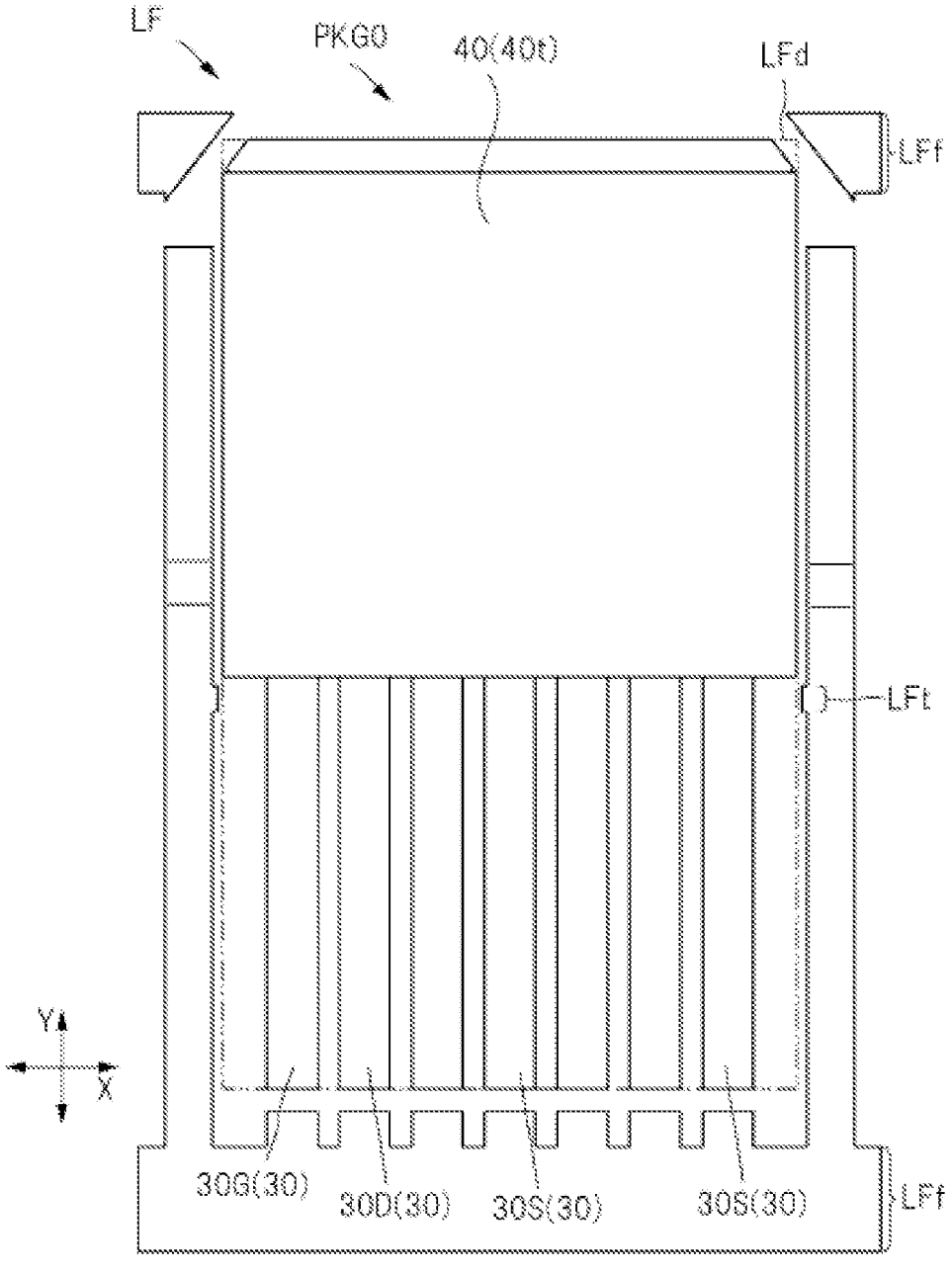
FIG. 33 is an enlarged plan view showing a state that a plurality of device-forming portions is separated from each other, in a singulation step shown in FIG. 11.

Next, in the singulation step shown in FIG. 11, as shown in FIG. 33, the assembly PKG0 corresponding to the semiconductor device PKG1 (see FIG. 3) is separated from the frame portion LFf and the tie bar LFt of the lead frame LF and singulated. FIG. 33 is the singulation step shown in FIG.

11, and is an enlarged plan view showing a state that a plurality of device-forming portions is separated from each other.

In this step, the frame portion LFf connected to the die pad 20 is cut, and the plurality of die pads 20 connected via the frame portion LFf are divided. In this step, the tie bar LFt is cut and the boundaries between the plurality of leads and the frame portion LFf are cut to separate the plurality of leads 30 from each other.

As a method of cutting the tie bar LFt, the frame portion LFf, and the lead 30, a processing method (press working) in which the cutting tool is sheared by pressing the cutting tool against the cut portion can be used. Since this step is performed after the plating step, the side surface newly formed by being cut in this step is exposed from the plating film (the metal films 22 and 32 shown in FIG. 6).

After this process, semiconductor device PKG1 of the finished product shown in FIG. 3 is obtained by conducting the required inspections and tests such as visual inspection and electric test. Then, semiconductor device PKG1 is shipped or mounted on a mounting substrate (not shown).

Although the invention made by the present inventor has been specifically described based on the embodiment, the present invention is not limited to the above embodiment and the modified example described in the above embodiment, and it is needless to say that the present invention can be variously modified without departing from the gist thereof. Hereinafter, a typical modified example will be described.

First Modified Example

First, as a first modified example, the lead bonding process described with reference to FIGS. 28 to 31 will be described. FIG. 34 to FIG. 37 are an enlarged cross-sectional view showing a modified example with respect to FIGS. 28 to 31.

In this step, the bonding step of the lead is performed by using a bonder (wedge bonder) 90 shown in FIGS. 34 to 37. For the present embodiment, six wire 12S are bonded to the wire 12S as shown in FIG. 27. In the following, one of the six wire 12S will be described as a typical example.

The bonder 90 has the same structure as the bonder 70 described with reference to FIGS. 15 to 26 except for the following points. The cutter 91 is located between the guide 92 and the wedge tool 93. Further, the area of the distal end surface (the surface pressing the wire) of the wedge tool 93 of the bonder 90 is smaller than the area of the distal end surface (the surface pressing the ribbon 51) of the wedge tool 73 of the bonder 70 shown in FIG. 15. Therefore, the bonder as a whole is smaller than the bonder 70. However, as a modified example, the bonding step of the lead can be performed by using the bonder 70 described with reference to FIGS. 15 to 26 or the bonder 80 described with reference to FIGS. 28 to 31.

As described below, the present modified example differs from the embodiment described with reference to FIGS. 28-31 in that the wire 12S is bonded to the lead 30S and the conductive member 50 in a reverse-bonding method. In this modification, the wire 12S is first joined to the lead joint of the lead 30S, so there is no fear of interfering between the clamper 86 and the guides 82 of the bonder 80 as in the embodiment described with reference to FIG. 31. Therefore, as can be seen by comparing FIG. 30 and FIG. 36, when the lead 12S is bonded to the portion 12B3 of the wire, the clamper 86 can be disposed in the vicinity of the portion 12B3. As described above, since the vicinity of the bonding portion can be suppressed by the clamper 86, the wire 12S and the lead 12S can be stabilized in the state modified example. Hereinafter, the present modified example will be described in detail.

Figure 34:
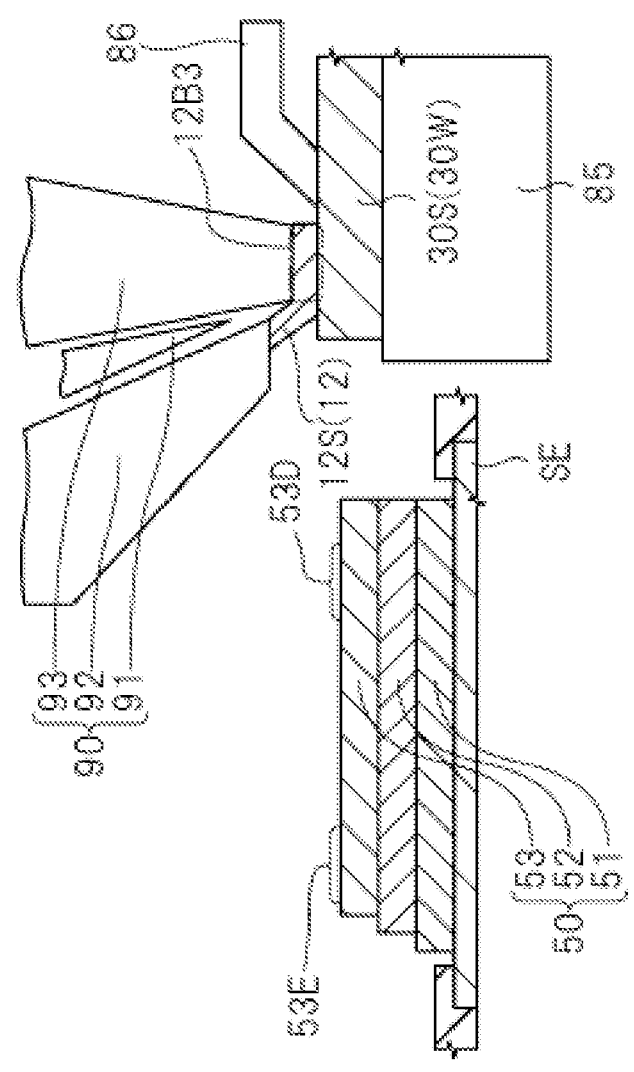
FIG. 34 is a modified example with respect to FIG. 28 and an enlarged cross-sectional view showing a state that the wire is bonded to the lead connecting portion of the source lead by using a wedge bonder, in the ribbon bonding step shown in FIG. 11.
Figure 35:
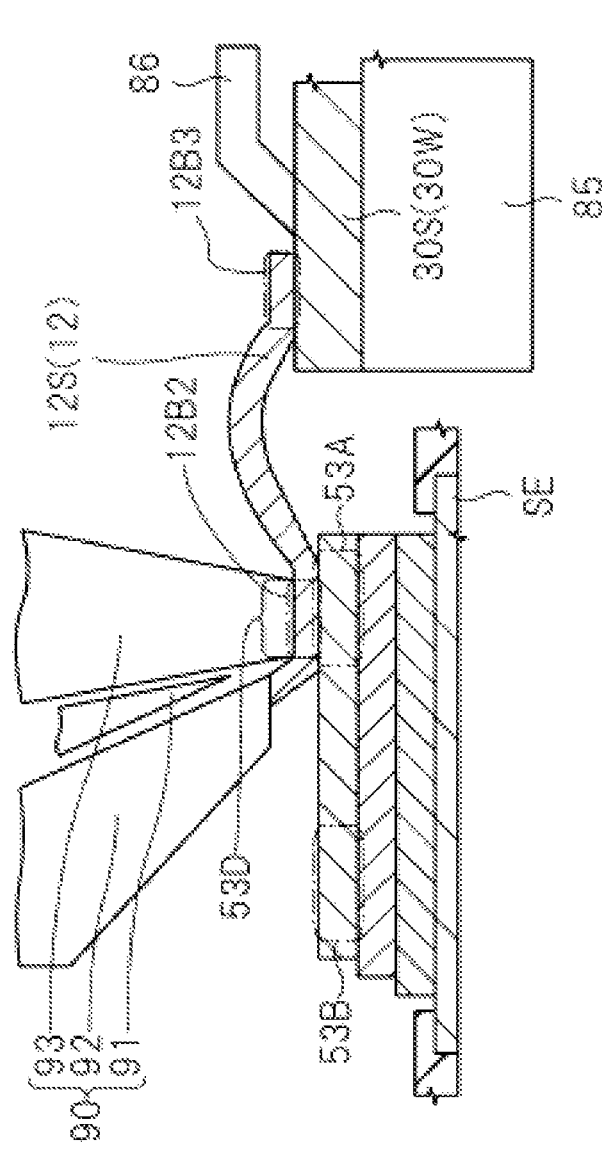
FIG. 35 is an enlarged cross-sectional view showing a state that the wire is bonded to the sixth-ribbon-bonding portion of the third ribbon, following FIG. 34.
Figure 36:
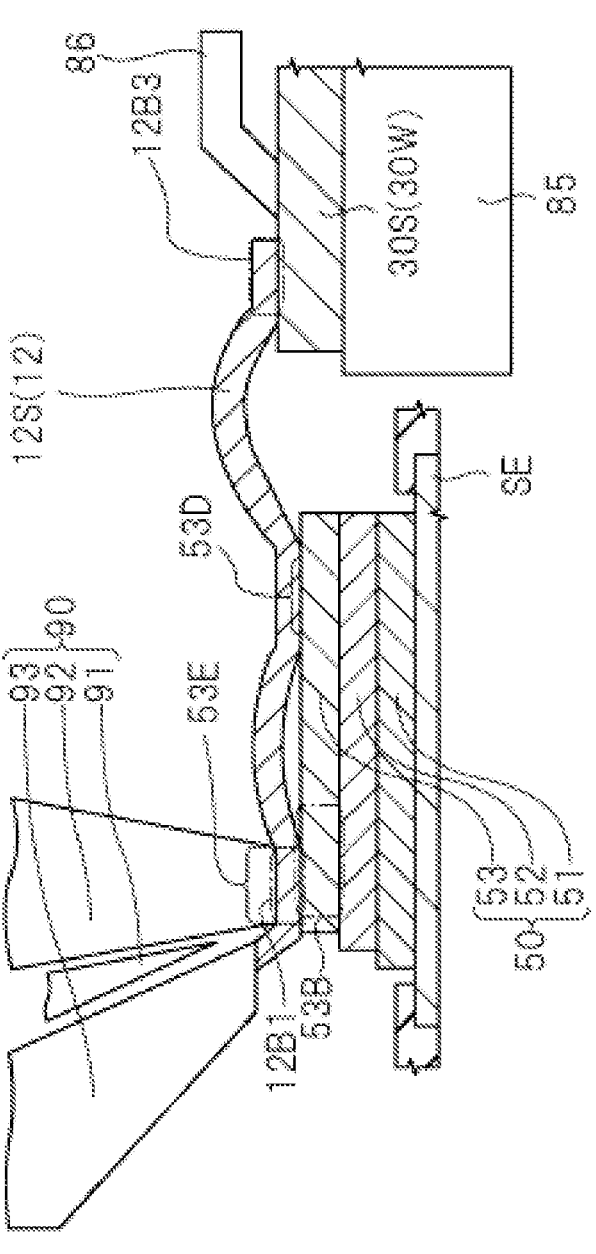
FIG. 36 is an enlarged cross-sectional view showing a state that the wire is bonded to the fifth-ribbon-bonding portion of the third ribbon, following FIG. 35.
Figure 37:
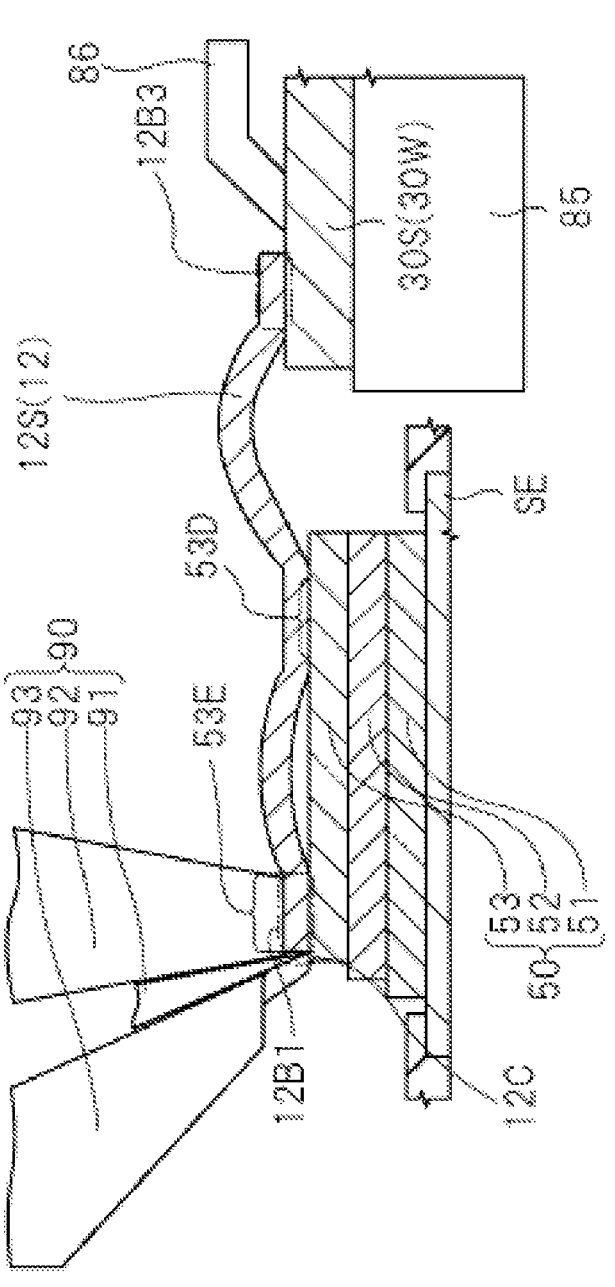
FIG. 37 is an enlarged cross-sectional view showing a state that the wire is cut, following FIG. 36.

As shown in FIG. 34, the bonding step of the lead includes a step of bonding the connecting portion 12B3 of the wire 12S to the lead-bonding portion 30W of the lead 30S. Further, as shown in FIG. 35, the bonding step of the lead includes a step of bonding the connecting portion 12B2 of the wire 12S to the ribbon-bonding portion 53D of the ribbon 53 after bonding the connecting portion 12B3 of the wire 12S. Further, although not shown, the lead junction step includes a step of moving the bonder 90 from the lead-bonding portion 30W onto the ribbon-bonding portion 53D after the step of bonding the connecting portion 12B3 and prior to the step of bonding the connecting portion 12B2. Further, the bonding step of the lead includes a step of bonding the connecting portion 12B3 of the wire 12S to the ribbon-bonded portion 53E of the ribbon 53 after bonding the connecting portion 12B2 of the wire 12S as shown in FIG. 36. Further, although not shown, the bonding step of the lead includes a step of moving the bonder 90 from the ribbon-bonding portion 53D onto the ribbon-bonded portion 53E after the step of bonding the connecting portion 12B2 and prior to the step of bonding the connecting portion 12B1. Further, the bonding step of the lead includes a step of, after bonding the connecting portion 12B1 of the wire 12S to the ribbon-bonded portion 53E, cutting the portion 12C of the wire 12S by the cutter 91 and separating the wire 12S including the connecting portion 12B1, the connecting portion 12B2, and the connecting portion 12B3 from the guide 92, as shown in FIG. 37.

In the present modified example, the wire bonding method is the same as the wire bonding method described with reference to FIGS. 28 to 30, except that the bonding order is different and the positions of the clampers 86 are different, and therefore, redundant explanation will be omitted.

Second Modified Example

Figure 38:
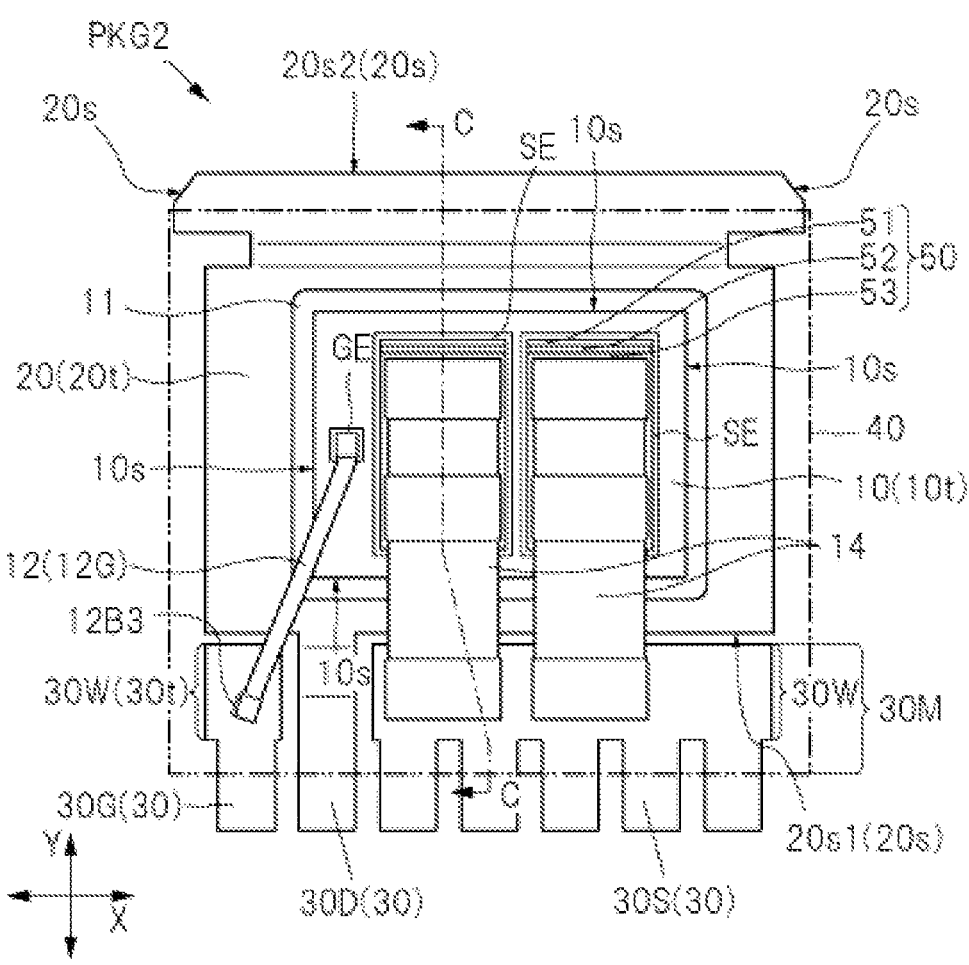
FIG. 38 is an enlarged plan view showing a modified example with respect to FIG. 5.
Figure 39:
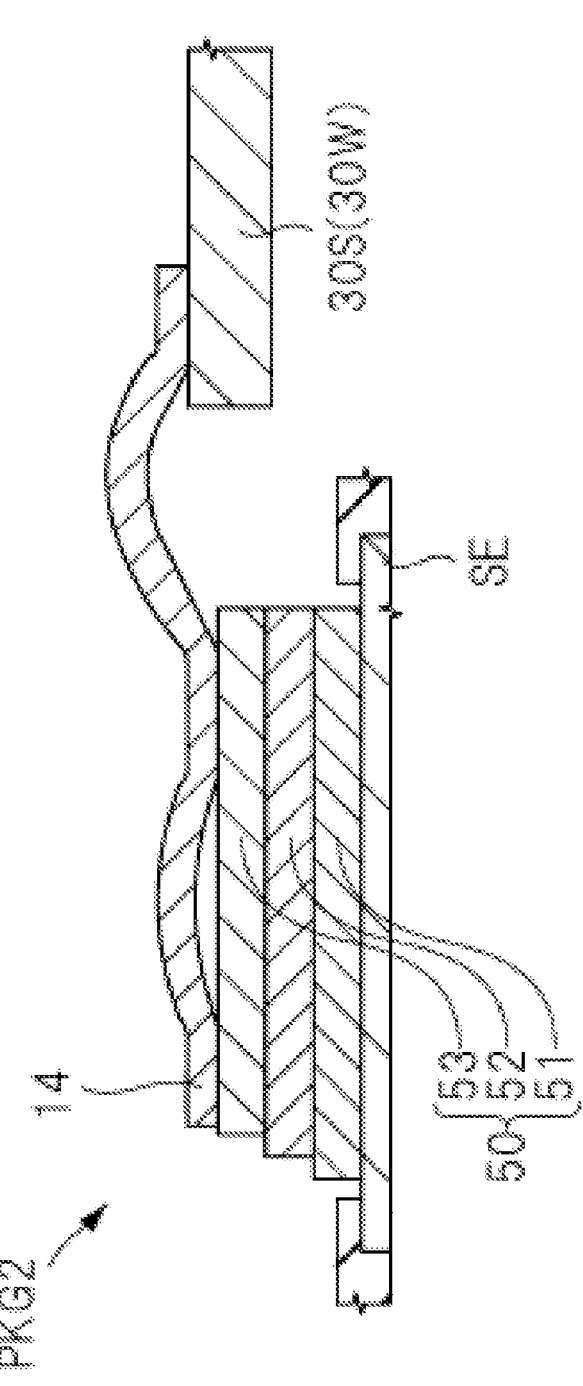
FIG. 39 is an enlarged cross-sectional view along C-C line shown in FIG. 38.

FIG. 38 is an enlarged plan view showing a modified example with respect to FIG. 5. FIG. 39 is an enlarged cross-sectional view along C-C line shown in FIG. 38. The semiconductor device PKG2 shown in FIGS. 38 and 39 differs from the semiconductor device PKG1 shown in FIG. 5 in that the conductive member for electrically connecting the conductive member 50 and the lead 30S is a ribbon (strip-shaped conductive member) 14.

The ribbon 14 is a band-shaped conductive member, and is made of, for example, aluminum. More specifically, in the case of the wire 12, the cross-sectional shape of the portion other than the joint portion with the pad or the lead of the semiconductor chip is a circular shape, but the cross-sectional shape of the joint portion with the pad or the lead of the semiconductor chip is an elliptical shape (or a band shape). On the other hand, in the case of the ribbon 14, the cross-sectional shape of not only the junction portion of the semiconductor chip with the pad or the lead but also the portion other than the bonding portion of the semiconductor chip with the pad or the lead is band-shaped. Also, the width (or cross-sectional area) of the ribbon 14 is thicker (larger) than the width (or cross-sectional area) of the wire 12. Even when the wire 12 shown in FIG. 5 is replaced with the ribbon 14, it can be manufactured in the same manner as the bonding step of the lead described above. In the lead bonding, a wedge bonder for ribbon bonding is used, but in order to join the ribbon 14 having a wide width, the same as the bonder 80 shown in FIGS. 28 to 31 or the bonder 90 shown in FIGS. 34 to 37 except that the width of each of the cutter, the guide, and the wedge tool is widened in the X direction shown in FIG. 38, and thus a repetitive description thereof will be omitted.

When the wire 12S shown in FIGS. 5 and 6 is replaced with the ribbon 14 shown in FIGS. 38 and 9, the following points are different.

First, since the ribbon 14 is wider than the wire 12S, it is difficult to bend the extending direction. Therefore, the wire 12 is preferable when the wire needs to be bent corresponding to the position of the lead joint 30W.

On the other hand, the ribbon 14 is wider than the wire 12, and therefore the bonding area with the conductive member 50 is large. Increasing the bonding area is preferable from the viewpoint of reducing the ON-resistance.

Third Modified Example

Figure 40:
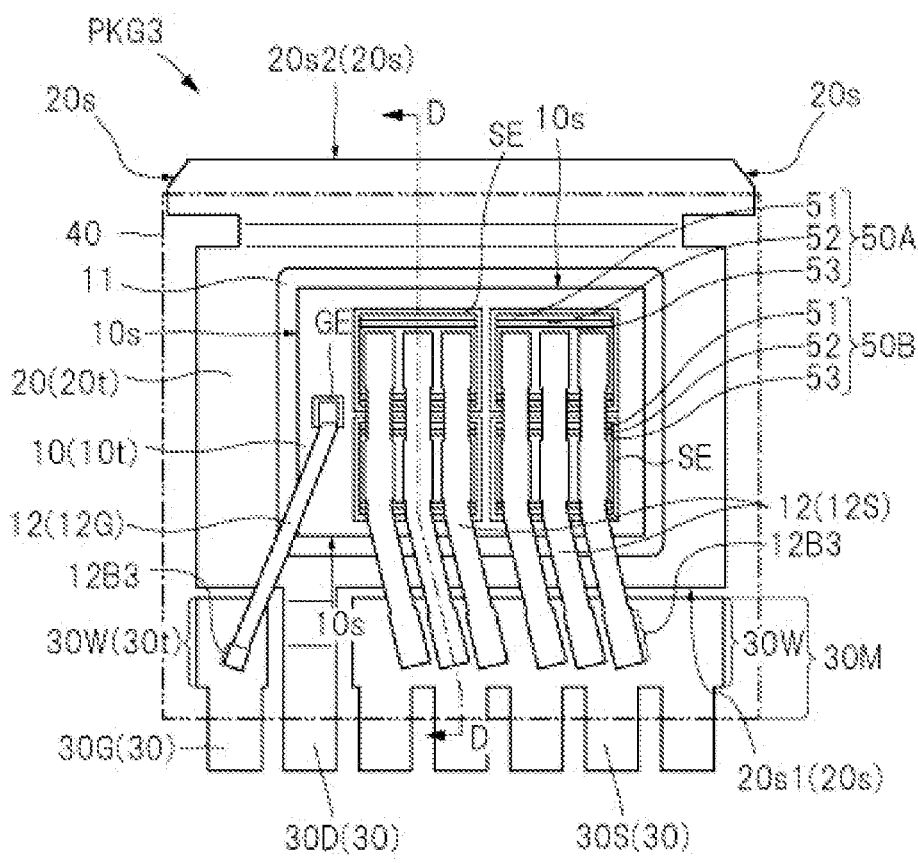
FIG. 40 is an enlarged plan view showing a modified example with respect to FIG. 5.
Figure 41:
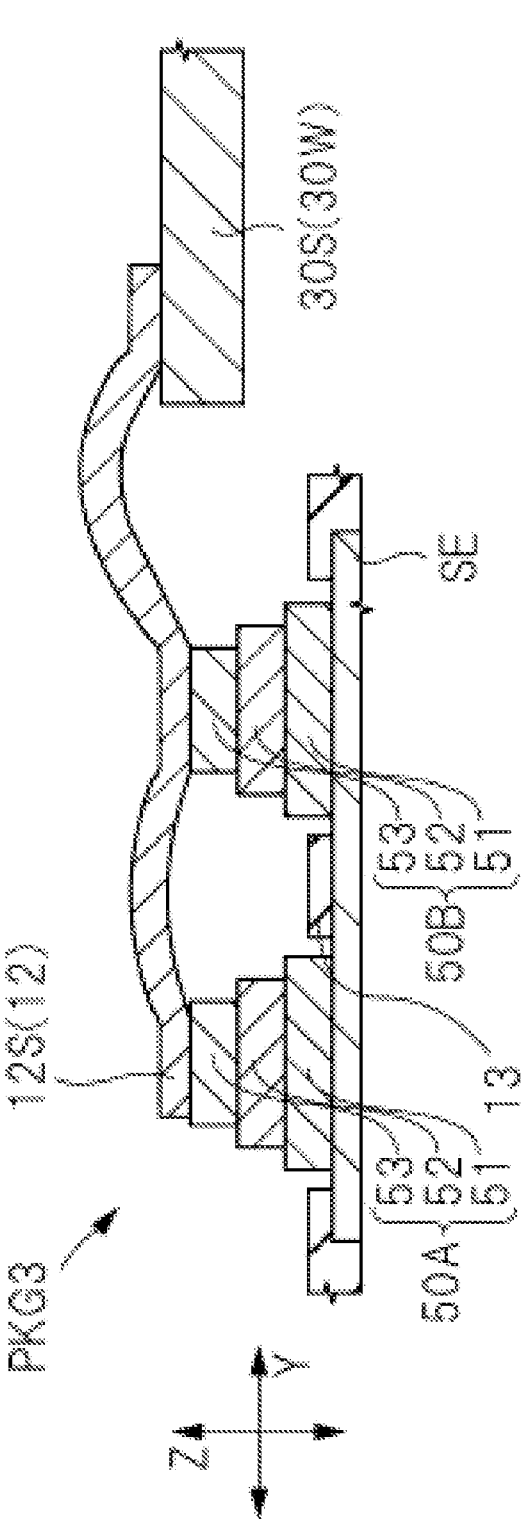
FIG. 41 is an enlarged cross-sectional view along D-D line shown in FIG. 40.

FIG. 40 is an enlarged plan view showing another modified example with respect to FIG. 5. FIG. 41 is an enlarged cross-sectional view along D-D line shown in FIG. 40. The semiconductor device PKG3 shown in FIGS. 40 and 41 differ from the semiconductor device PKG1 shown in FIG. 5 in that, in the Y direction, each of the conductive member 50A and the conductive member 50B spaced apart from each other is bonded to the source-pad SE. As shown in FIG. 41, an insulating film 13 is formed between the conductive member 50A and the conductive member 50B, and the source pad SE is covered with the insulating film 13. Each of the conductive member 50A and the conductive member 50B includes a ribbon 51, a ribbon 52, and a ribbon 53. This point is the same as the conductive member 50 shown in FIG. 6.

From the viewpoint of suppressing the separation between the source pad SE and the sealing body 40 shown in FIG. 6, it is preferable to reduce the exposed area of the source and pad SE. As in the present modified example, when the conductive member 50A and the conductive member 50B are selectively disposed at a part where the wire 12S is bonded and a part of the source pad SE is covered with the insulating film 13 between the conductive member 50A and the conductive member it is preferable that the exposed area of the source pad SE can be reduced as compared with semiconductor device PKG1 shown in FIG. 5.

In the present modified example, in the above-described step of bonding the conductive member on the pad, a step of cutting the ribbon 51 is required after bonding the ribbon 51 which is a part of the conductive member 50B and prior to bonding the ribbon 51 which is a part of the conductive member Therefore, from the viewpoint of efficiency the manufacturing process, semiconductor device PKG1 shown in FIG. 5 and manufacturing method of semiconductor device PKG2 shown in FIG. 38 are preferable from the viewpoint of reducing the number of manufacturing steps.

As a further modified example, in the configuration of semiconductor device PKG2 shown in FIG. 4, the wire 12S may be replaced with the ribbon 14 in the same manner as semiconductor device PKG2 shown in FIG. 38 described above.

The conductive member for electrically connecting the conductive member 50 and the lead 30S is different from semiconductor device PKG1 shown in FIG. 5 in that it is the ribbon 14.

Fifth Modified Example

Further, although not shown, as another modified example with respect to FIG. 5, each of the plurality of wire 12S may be bonded to one conductive member 50 at three or more positions. Since the bonding area between the wire 12S and the conductive member 50 increases, the impedance of the conductive path through the wire 12S and the conductive member 50 can be reduced.

Sixth Modified Example

Further, for example, although various modified example have been described as described above, modified example described above can be combined and applied. A part of modified example may be extracted and combined.

What is claimed is:

1. A method of manufacturing a semiconductor device, comprising steps of:
    (a) providing a lead frame having a die pad and a first lead spaced apart from the die pad, the die pad having a first surface and a second surface opposite the first surface;
    (b) after the step of (a), mounting a semiconductor chip on the first surface of the die pad, the semiconductor chip having a MOSFET and a source pad electrically coupled with a source of the MOSFET;
    (c) after the step of (b), bonding a first conductive member to the source pad located below the first lead in cross-sectional view, by using a first bonder;
    (d) after the step of (c), bonding a second conductive member to each of the first conductive member and the first lead, by using a second bonder; and
    (e) after the step of (d), sealing the semiconductor chip, the first conductive member and the second conductive member with a resin,
    wherein the first bonder has:
        a cutter capable of cutting the first conductive member;
        a guide capable of supplying the first conductive member; and
        a wedge tool located adjacent to the cutter and capable of pressing the first conductive member,
    wherein in the step of (c), the first bonder is disposed such that the guide of the first bonder is located farther away from the first lead than the wedge tool of the first bonder; and
    wherein the step of (c) further comprises:
        (c1) bonding a first portion of the first conductive member to a first-pad-bonding portion of the source pad; and
        (c2) after the step of (c1), bonding a second portion of the first conductive member to a second-pad-bonding portion, which is located farther away from the first lead than the first-pad-bonding portion, of the source pad.

2. The method according to claim 1,
    wherein the first conductive member is comprised of a plurality of ribbons laminated on the source pad,
    wherein the step of (c1) further comprises bonding a first portion of a first ribbon of the plurality of ribbons to the first-pad-bonding portion of the source pad,
    wherein the step of (c2) after the step of (c1) further comprises bonding a second portion of the first ribbon to the second-pad-bonding portion, which is located farther away from the first lead than the first-pad-bonding portion, of the source pad, and
    wherein the step of (c) further comprises:
        (c3) after the step of (c2), cutting a third portion of the first ribbon by the cutter, and separating the first ribbon including the first portion and the second portion from the guide;

(c4) after the step of (c3), bonding a fourth portion of a second ribbon of the plurality of ribbons to a first-ribbon-bonding portion of the first ribbon;

(c5) after the step of (c4), bonding a fifth portion of the second ribbon to a second-ribbon-bonding portion, which is located farther away from the first lead than the first-ribbon-bonding portion, of the first ribbon; and (c6) after the step of (c5), cutting a sixth portion of the second ribbon by the cutter, and separating the second ribbon including the fourth portion and the fifth portion from the guide.

3. The method according to claim 2, wherein the step of (c) further comprises:

(c7) after the step of (c6), bonding a seventh portion of a third ribbon of the plurality of ribbons to a third-ribbon-bonding portion of the second ribbon;

(c8) after the step of (c7), bonding an eighth portion of the third ribbon to a fourth-ribbon-bonding portion, which is located farther away from the first lead than the third-ribbon-bonding portion, of the second ribbon; and (c9) after the step of (c8), cutting a nineth portion of the third ribbon by the cutter, and separating the third ribbon including the seventh portion and the eighth portion from the guide.

4. The method according to claim 3, wherein, in the step of (c6), a separation distance between the fourth portion and the fifth portion is longer than a separation distance between the first portion and the second portion, and wherein, in the step of (c9), a separation distance between the seventh portion and the eighth portion is longer than a separation distance between the fourth portion and the fifth portion.

5. The method according to claim 2, wherein, in the step of (c6), a separation distance between the fourth portion and the fifth portion is longer than a separation distance between the first portion and the second portion.

6. The method according to claim 2, wherein, in the step of (c4), the first-ribbon-bonding portion of the first ribbon is located at a position closer to the first lead than the first portion of the first ribbon.

7. The method according to claim 6, wherein, in the step of (c5), the second-ribbon-bonding portion of the first ribbon is located at a position farther away from the first lead than the second portion of the first ribbon.

8. The method according to claim 1, wherein, in the step of (d), by using the second bonder, the second conductive member is bonded to the first lead after the second conductive member is bonded to the first conductive member.

9. The method according to claim 8, wherein the second conductive member is a wire made of copper or copper alloy.

10. The method according to claim 1, wherein, in the step of (d), by using the second bonder, the second conductive member is bonded to the first conductive member after the second conductive member is bonded to the first lead.

11. The method according to claim 1, wherein the step of (d) further comprises:

(d1) bonding a first connecting portion of the second conductive member to one portion of the first conductive member; and (d2) after the step of (d1), bonding a second connecting portion of the second conductive member to another portion, which is a different portion from the one portion, of the first conductive member, wherein the source pad has:

a first side extending in a first direction crossing an arrangement direction of the first connecting portion and the second connecting portion; and a second side opposite the first side and extending in the first direction, wherein a first distance from the first connecting portion to the first side is shorter than a second distance between the first connecting portion and the second connecting portion, and wherein a third distance from the second connecting portion to the second side is shorter than the second distance.

12. The method according to claim 1, wherein the lead frame further includes a second lead supporting the die pad and bent so as to locate the die pad at a position below the first lead in cross-sectional view.

13. The method according to claim 1, wherein a sealing body formed by performing the step of (e) has:

an upper surface;

a lower surface opposite the upper surface; and a side surface located between the upper surface and the lower surface, and wherein, in the step of (e), the semiconductor chip, the first conductive member and the second conductive member are sealed with the resin such that the first lead is exposed from the side surface of the sealing body and such that the second surface of the die pad is exposed from the lower surface of the sealing body.

*    *    *    *    *